United States Patent
Varnica

(10) Patent No.: US 7,805,652 B1
(45) Date of Patent: Sep. 28, 2010

(54) METHODS FOR GENERATING AND IMPLEMENTING QUASI-CYCLIC IRREGULAR LOW-DENSITY PARITY CHECK CODES

(75) Inventor: Nedeljko Varnica, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 1050 days.

(21) Appl. No.: 11/507,161

(22) Filed: Aug. 21, 2006

Related U.S. Application Data

(60) Provisional application No. 60/772,035, filed on Feb. 10, 2006.

(51) Int. Cl.
*H03M 13/00* (2006.01)

(52) U.S. Cl. .................... 714/752; 714/755; 714/786
(58) Field of Classification Search .............. 714/752, 714/755, 800, 786, 758
See application file for complete search history.

(56) References Cited

U.S. PATENT DOCUMENTS

| 7,499,490 B2 * | 3/2009 | Divsalar et al. ............. 375/240 |
| 7,523,375 B2 * | 4/2009 | Spencer ....................... 714/752 |
| 7,607,065 B2 * | 10/2009 | Bickerstaff et al. ......... 714/755 |

OTHER PUBLICATIONS

"A New Construction for LDPC Codes using Permutation Polynomials over Integer Rings"; Oscar Y. Takeshita; Jun. 24, 2005; Submitted to IEEE Transactions on Information Theory; 12 Pages.
"On the Computation of the Minimum Distance of Low-Density Parity-Check Codes"; Xiao-Yu Hu and Marc P.C. Fossorier; IBM Research, Zurich Research Laboratory, 8803 Ruschlikon, Switzerland; 17 Pages.

* cited by examiner

*Primary Examiner*—Fritz Alphonse

(57) ABSTRACT

A device includes a supernode generator module, a supernode splitting module, and a control module. The supernode generator module generates S supernodes each comprising d symbol nodes, where S and d are integers greater than 1. The supernode splitting module splits each of the S supernodes into d derived symbols, wherein a total number of symbol edges of the d derived symbols is equal to a predetermined number of symbol edges of each of the S supernodes. The control module generates a quasi-cyclic irregular low density parity check (LDPC) code based on S*d derived symbols, wherein S equals the S supernodes and d equals the d derived symbols.

50 Claims, 16 Drawing Sheets

| $i'$ | 0 | $k$ | $2k$ | ... | $tk$ | ... | $(\beta-1)k$ |
|---|---|---|---|---|---|---|---|
| $i$ | 0 | 1 | 2 | ... | $t$ | ... | $\beta-1$ |
| $x$ | 0 1 2 ... $\lambda-1$ | $\lambda$ $\lambda+1$ $\lambda+2$ ... | $2\lambda$ $2\lambda+1$ $2\lambda+2$ ... | ... | | | |
| $C$ | 0 0 2$f_2$ | | | | $C_t=(C_{t-1}+2f_2) \bmod N$ | | |
| $y$ | 0 $f_1+f_2$ | | | | $y_t=(y_{t-1}+f_1+f_2+C_t) \bmod N$ | | |
| $j$ | | | | | $j=\left\lfloor \dfrac{y}{\rho} \right\rfloor$ | | |
| $j'$ | | | | | $j'=\left\lfloor \dfrac{j}{\gamma} \right\rfloor + \iota \cdot (j \bmod \gamma)$ | | |

*FIG. 12*

METHODS FOR GENERATING AND IMPLEMENTING QUASI-CYCLIC IRREGULAR LOW-DENSITY PARITY CHECK CODES

CROSS-REFERENCE TO RELATED APPLICATIONS

This application claims the benefit of U.S. Provisional Application No. 60/772,035, filed on Feb. 10, 2006. The disclosure of the above application is incorporated herein by reference in its entirety.

FIELD

The present disclosure relates to data processing systems, and more particularly to designing and implementing error-correcting codes.

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

In recent years, use of large-scale networks that exchange, process, and store large amounts of data at high speeds is proliferating. Consequently, demand for reliable data transmission and storage systems is increasing. Referring now to FIG. 1, a typical communication or storage system 10 comprises an information source 12, a source encoder 14, a channel encoder 16, and a modulator 18. The system 10 further comprises a communication channel (or a storage medium) 20. The system 10 further comprises a demodulator 22, a channel decoder 24, a source decoder 26, and a destination 28.

The information source 12 may be an analog source such as a sensor that outputs information as continuous waveforms or a digital source such as a computer that outputs information in a digital form. The source encoder 14 converts the output of the information source 12 into a sequence of binary digits (bits) called an information sequence u. The channel encoder 16 converts the information sequence u into a discrete encoded sequence v called a codeword. The modulator 18 transforms the codeword into a waveform of duration T seconds that is suitable for transmission (or recording).

The waveform output by the modulator 18 is transmitted via the communication channel (or stored in the storage medium) 20. Typical examples of the communication channel 20 are telephone lines, wireless communication channels, optical fiber cables, etc. Typical examples of the storage medium 20 are magnetic disks, tapes, etc. Noise, such as thermal noise, electromagnetic interference, inter-channel crosstalk, etc., may corrupt the waveform.

The demodulator 22 receives the waveform. The demodulator 22 processes each waveform and generates a received sequence r that is either a discrete (quantized) or a continuous output. The channel decoder 24 converts the received sequence r into a binary sequence u' called an estimated information sequence. The source decoder 26 converts u' into an estimate of the output of the information source 12 and delivers the estimate to the destination 28. The estimate may be a faithful reproduction of the output of the information source 12 when u' resembles u despite decoding errors that may be caused by the noise.

System designers strive to find ways to control and minimize errors in data transmission and data storage so that data can be reliably reproduced. For example, system designers strive to design codes and channel encoders (hereinafter encoders) that can combat noise. Implementation of encoders partly depends on types of codes used to encode data.

An encoder using a block code typically divides data into blocks of k bits (symbols) each. A message block is generally represented as a binary k-bit message denoted by $u = (u0, u1, \ldots, u_{k-1})$. The encoder transforms each message u independently into an n-bit codeword denoted by $v = (v0, v1, \ldots, v_{n-1})$. v is also called a code vector of the message u. Thus, a k-bit message block can comprise $2^k$ messages, and the encoder may output $2^k$ codewords for $2^k$ possible messages. A set of $2^k$ codewords of length n is called an (n,k) block code.

When k<n, (n–k) redundant bits may be added to each message to form a codeword. The redundant bits enable a code to combat channel noise. The ability of a code to combat noise can be increased by adding more redundant bits to codewords. For example, more redundant bits can be added by increasing a number of message bits k and a block length n of a code while holding a ratio k/n constant. This, however, may increase complexity and cost of hardware used to implement encoders.

Encoder design may be simplified by using block codes that are linear. This is because linear codes have properties that can be represented mathematically. For example, linear codes may be represented by matrices, polynomials, Tanner graphs, etc. Therefore, encoders using linear codes may be easily implemented using simple hardware such as shift registers.

A block code of length n and $2^k$ codewords is called a linear (n,k) code if a modulo-2 sum of two codewords is also a codeword. In that case, every codeword v in the linear code (n,k) is a linear combination of k linearly independent codewords, $g0, g1, \ldots, g_{k-1}$. That is, $v = u0g0 + u1g1 + \ldots + u_{k-1}g_{k-1}$, where $u_i = 0$ or 1 for $0 \leq i < k$.

The k linearly independent codewords can be arranged as rows of a k×n matrix as follows.

$$G = \begin{bmatrix} g_0 \\ g_1 \\ \cdot \\ \cdot \\ \cdot \\ g_{k-1} \end{bmatrix} = \begin{bmatrix} g_{00} & g_{01} & \cdots & g_{0,n-1} \\ g_{10} & g_{11} & \cdots & g_{1,k-1} \\ \cdot & \cdot & & \cdot \\ \cdot & \cdot & & \cdot \\ \cdot & \cdot & & \cdot \\ g_{k-1,0} & g_{k-1,1} & \cdots & g_{k-1,n-1} \end{bmatrix}$$

where $g_i = (g_{i0}, g_{i1}, \ldots, g_{i,(n-1)})$ for $0 \leq i < k$.

Thus, if $u = (u0, u1, \ldots, u_{k-1})$ is a message to be encoded, a corresponding codeword is expressed as follows.

$$v = u * G$$

$$= (u0, u1, \ldots, u_{k-1}) * \begin{bmatrix} g_0 \\ g_1 \\ \cdot \\ \cdot \\ \cdot \\ g_{k-1} \end{bmatrix}$$

$$= u0g0 + u1g1 + \ldots + u_{k-1}g_{k-1}$$

Rows of matrix G generate the linear code (n,k). Therefore, matrix G is called a generator matrix for the linear code (n,k). Implementing an encoder that uses the linear code (n,k) is simplified because the encoder may store only k rows of the matrix G to form a linear combination of the k rows based on the input message u.

Codewords of linear codes generally comprise a message part and a redundant part. The message part comprises k unaltered information (or message) digits. The redundant part comprises (n−k) parity check digits, which are linear sums of the information digits. A linear (n,k) code may be alternatively specified by a k×n matrix G as follows.

$$G = \begin{bmatrix} g_0 \\ g_1 \\ . \\ . \\ . \\ g_{k-1} \end{bmatrix} = \begin{bmatrix} p_{00} & p_{01} & \cdots & p_{0,n-k-1} & 1 & 0 & 0 & \cdots & 0 \\ p_{10} & p_{11} & \cdots & p_{1,n-k-1} & 0 & 1 & 0 & \cdots & 0 \\ . & . & & . & & & & & \\ . & . & & . & & & & & \\ . & . & & . & & & & & \\ p_{k-1,0} & p_{k-1,1} & \cdots & p_{k-1,n-k-1} & 0 & 0 & 0 & \cdots & 1 \end{bmatrix}$$

where $p_{ij}$=0 or 1.

If $u=(u0, u1, \ldots, u_{k-1})$ is the message to be encoded, the codeword v is expressed as follows.

$$v = (v0, v1, \ldots, v_{n-1})$$

$$= (u0, u1, \ldots, u_{k-1}) * G$$

Thus, $v_{n-k+i} = u_i$ for $0 \leq i < k$, and $v_j = u_0 p_{0j} + u_1 p_{1j} + \ldots + u_{k-1} p_{k-1,j}$ for $0 \leq j < (n-k)$. The (n−k) equations for $v_j$ are called the parity check equations of the code.

The linear code (n,k) generated by G can also be described as a null space of a (n−k)×n matrix H, where H is called a parity check matrix of the code (n,k) and is expressed as follows.

$$H = \begin{bmatrix} 1 & 0 & \cdots & 0 & p_{00} & p_{10} & \cdots & p_{k-1,0} \\ 0 & 1 & \cdots & 0 & p_{01} & p_{11} & \cdots & p_{k-1,1} \\ . & & & . & . & . & & . \\ . & & & . & . & . & & . \\ . & & & . & . & . & & . \\ 0 & 0 & \cdots & 1 & p_{0,n-k-1} & p_{1,n-k-1} & \cdots & p_{k-1,n-k-1} \end{bmatrix}$$

Some linear codes are cyclic or quasi-cyclic. An (n,k) linear code is called a cyclic code if every cyclic shift of a codeword is also a codeword. If a codeword $v=(v0, v1, \ldots, v_{n-1})$ is cyclically shifted one place to the right, a resultant codeword is give by $v^{(1)} = (v_{n-1}, v0, v1, \ldots, v_{n-2})$. Thus, if the codeword v is cyclically shifted i places to the right, a resultant codeword is expressed as follows.

$$v^{(i)} = (v_{n-i}, v_{n-i+1}, \ldots v_{n-1}, v0, v1, \ldots, v_{n-i-1})$$

Cyclically shifting v by i places to the right is equivalent to cyclically shifting v by (n−i) places to the left.

Cyclic codes may be mathematically represented by polynomials. For example, a codeword $v=(v0, v1, \ldots, v_{n-1})$ can be expressed in the form of a polynomial as follows.

$$v(X) = v0 + v1 X + v2 X^2 + \ldots + v_{n-1} X^{n-1}$$

Thus, each codeword corresponds to a polynomial of degree (n−1) or less. For example, if $v_{n-1} \cdot 0$, the degree of v(X) is (n−1). If $v_{n-1}=0$, the degree of v(X) is less than (n−1). Since correspondence between v and v(X) is one to one, v(X) is called a code polynomial of v.

Cyclic codes possess full cyclic symmetry. That is, cyclically shifting a codeword of a cyclic code by any number of symbol positions either to the left or to the right results in another codeword. Therefore, encoders using cyclic codes and corresponding decoders can be easily implemented using simple shift registers and logic circuits.

On the other hand, quasi-cyclic codes do not possess full cyclic symmetry. Instead, quasi-cyclic codes possess partial cyclic symmetry. Specifically, a quasi-cyclic code is a linear code wherein cyclically shifting a codeword a fixed number $n_0 \neq 1$ (a multiple of $n_0$) of symbol positions either to the right or to the left yields another codeword. $n_0$, which is an integer, is called a shifting constraint. Thus, a quasi-cyclic code with $n_0=1$ is a cyclic code.

Quasi-cyclic codes can be represented using matrices called circulant matrices or circulants. A circulant is a square matrix (e.g., a k×k matrix). For any given integer m<k, shifting a column (or a row) by m positions results in another column (or row) of the circulant.

A low-density parity check (LDPC) code is defined as a null space of a parity check matrix having row weights and column weights that are small relative to a length of the code and a number of rows in the parity check matrix. Row weights denote number of 1's in rows of the parity check matrix, and column weights denote number of 1's in columns of the parity check matrix. Since row weights and column weights of the parity check matrix are small, the parity check matrix has a low density of 1's. Consequently, the parity check matrix is a sparse matrix and is called a low-density parity check matrix.

If H denotes the low density parity check matrix, λ denotes the column weight of H, and ρ denotes the row weight of H, then the code specified by H is called a low density parity check code or a (λ,ρ)-regular LDPC code. The code is called regular when the column weight λ and the row weight ρ are constant. On the other hand, when all the columns and all the rows of H do not have identical weight, an LDPC code specified by H is called an irregular LDPC code.

Referring now to FIG. 2, Tanner graphs may be used to graphically represent linear codes such as LDPC codes. A Tanner graph G 40 is denoted by G=(V, E), where V is a set of vertices 42 and E is a set of edges 44. V={v1, v2, ..., v8} and E={a, b, ..., h}. The Tanner graph G 40 is called a bipartite graph since vertices V 42 can be partitioned into two disjoint subsets V1={v1, v2, v3} and V2={v4, v5, ..., v8} such that every edge 44 joins a vertex in V1 to a vertex in V2, and no two vertices in V1 or V2 are connected. A number of edges that are incident on a vertex $v_i$ is called a degree of the vertex $v_i$ and is denoted by $d(v_i)$. For example, degree of vertex v2 is three since edges c, d, and e are incident on vertex v2. Vertices may also be called nodes.

Tanner graphs of linear codes display incidence relationships between code bits of the linear codes and parity checksums that check on the code bits. For a linear code of length n specified by a parity check matrix H with J rows, h1, h2, $h_j$, a Tanner graph G comprises two sets of vertices V1 and V2. V1 comprises n vertices, v0, v1, ..., $v_{n-1}$, that represent n code bits of the code and are called code bit vertices. Code bit vertices are also called symbol nodes or variable nodes. V2 comprises J vertices that represent J parity checksums or equations, s1, s2, $s_j$, that the code bits satisfy and are called checksum vertices or check nodes.

A symbol node $v_i$ is connected to a check node $s_j$ by an edge denoted by $(v_i, s_j)$ only if the code bit $v_i$ is contained in (or checked by) the parity checksum $s_j$. A degree of the symbol node $v_i$ is equal to a number of parity checksums that contain $v_i$. Thus, the degree of a symbol node is equal to a number of edges or symbol node edges with which the symbol node connects to its check nodes. Similarly, a degree of the check node $s_j$ is equal to a number of code bits that are checked by $s_j$. Thus, the degree of a check node is equal to a number of edges or check node edges with which the check node connects to its symbol nodes.

For a regular LDPC code, degrees of all symbol nodes in a Tanner graph are identical and are equal to a column weight $\lambda$ of H. Similarly, degrees of all check nodes are identical and are equal to a row weight $\rho$ of H. Such a Tanner graph is said to be regular. This is helpful in generating regular LDPC codes and in implementing encoders that use regular LDPC codes.

On the other hand, an irregular LDPC code is defined by a parity check matrix H having multiple column weights and multiple row weights. Thus, a Tanner graph of the irregular LDPC code comprises symbol nodes having multiple degrees and check nodes having multiple degrees. Consequently, generating irregular LDPC codes and implementing encoders that use irregular LDPC codes is relatively complex.

SUMMARY

A device comprises a supernode generator module, a supernode splitting module, and a control module. The supernode generator module generates S supernodes each comprising d symbol nodes, where S and d are integers greater than 1. The supernode splitting module splits each of the S supernodes into d derived symbols, wherein a total number of symbol edges of the d derived symbols is equal to a predetermined number of symbol edges of each of the S supernodes. The control module generates a quasi-cyclic irregular low density parity check (LDPC) code based on S*d derived symbols, wherein S equals the S supernodes and d equals the d derived symbols.

In another feature, the supernode generator module receives data that includes n symbol nodes each having symbol edges that connect the n symbol nodes to r check nodes, where n and r are integers greater than 1 and n=S*d.

In another feature, the supernode generator module selects the d symbol nodes from the n symbol nodes and groups the d symbol nodes in each of the S supernodes, and wherein a sum of symbol edges of the d symbol nodes is the same for each of the S supernodes.

In another feature, every $P^{th}$ derived symbol generated by the S supernodes that are separated by a predetermined supernode distance has the same number of symbol edges, where P is an integer and $1 \leq P \leq d$.

In another feature, the d derived symbols connect to r check nodes with the predetermined number of symbol edges, where r is an integer greater than 1.

In another feature, the control module performs a permutation of the predetermined number of symbol edges of the S*d derived symbols and check node edges of r check nodes using a permutation polynomial, where r is an integer greater than 1. The control module generates an irregular LDPC code based on the permutation.

In another feature, the control module generates a parity check matrix, wherein columns of the parity check matrix comprise the S*d derived symbols and rows of the parity check matrix comprise r check nodes, where r is an integer greater than 1.

In another feature, the control module performs permutations of columns and rows of the parity check matrix and generates a quasi-cyclic parity check matrix.

In another feature, the quasi-cyclic parity check matrix comprises submatrices that are circulant matrices.

In another feature, each of the circulant matrices comprises derived symbols that are selected from the S*d derived symbols, that have the same number of symbol edges, and that are generated by the S supernodes that are separated by a predetermined supernode distance.

In another feature, a distance between the derived symbols that are selected from the S*d derived symbols is equal to the predetermined supernode distance multiplied by d.

In another feature, the control module generates the quasi-cyclic irregular LDPC code based on the quasi-cyclic parity check matrix.

In another feature, the control module joins the quasi-cyclic parity check matrix and a square quasi-cyclic matrix.

In another feature, the square quasi-cyclic matrix is an identity matrix.

In another feature, the square quasi-cyclic matrix comprises circulant matrices of the same size.

In another feature, the circulant matrices have a row weight and a column weight equal to 1.

In another feature, a row weight and a column weight of a last of the circulant matrices are equal to 2.

In another feature, the quasi-cyclic parity check matrix is a sparse matrix.

In still other features, a system comprises the device, wherein the device generates a plurality of quasi-cyclic irregular LDPC codes.

In another feature, the system further comprises a decoder module and a code selection module. The decoder module communicates with the device and decodes the LDPC codes. The code selection module communicates with the decoder module and determines error-correcting ability of the LDPC codes by calculating at least one of burst correction power and girth of the LDPC codes.

In another feature, the code selection module calculates the girth based on Tanner graphs constructed using the S*d derived symbols.

In another feature, the system further comprises a burst selection module that selects bursts of M consecutive symbols from a data block encoded by one of the LDPC codes, where M is an integer at least equal to 1.

In another feature, the code selection module inputs incorrect log-likelihood ratios (LLRs) for the M consecutive symbols to the decoder module and determines whether the decoder module correctly decodes the data block.

In another feature, the code selection module determines the burst correction power of the one of the LDPC codes as a value of M when the decoder module fails to decode the data block.

In still other features, a method comprises generating S supernodes each comprising d symbol nodes, where S and d are integers greater than 1, splitting each of the S supernodes into d derived symbols, wherein a total number of symbol edges of the d derived symbols is equal to a predetermined number of symbol edges of each of the S supernodes, and generating a quasi-cyclic irregular low density parity check (LDPC) code based on S*d derived symbols, wherein S equals the S supernodes and d equals the d derived symbols.

In another feature, the method further comprises receiving data that includes n symbol nodes each having symbol edges that connect the n symbol nodes to r check nodes, where n and r are integers greater than 1 and n=S*d.

In another feature, the method further comprises selecting the d symbol nodes from the n symbol nodes and grouping the d symbol nodes in each of the S supernodes, and wherein a sum of symbol edges of the d symbol nodes is the same for each of the S supernodes.

In another feature, every $P^{th}$ derived symbol generated by the S supernodes that are separated by a predetermined supernode distance has the same number of symbol edges, where P is an integer and $1 \leq P \leq d$.

In another feature, the d derived symbols connect to the r check nodes with the predetermined number of symbol edges, where r is an integer greater than 1.

In another feature, the method further comprises performing a permutation of the predetermined number of symbol edges of the S*d derived symbols and check node edges of r check nodes using a permutation polynomial, where R is an integer greater than 1.

In another feature, the method further comprises generating an irregular LDPC code based on the permutation.

In another feature, the method further comprises generating a parity check matrix, wherein columns of the parity check matrix comprise the S*d derived symbols and rows of the parity check matrix comprise r check nodes, where r is an integer greater than 1.

In another feature, the method further comprises performing permutations of columns and rows of the parity check matrix and generating a quasi-cyclic parity check matrix.

In another feature, the quasi-cyclic parity check matrix comprises submatrices that are circulant matrices.

In another feature, each of the circulant matrices comprises derived symbols that are selected from the S*d derived symbols, that have the same number of symbol edges, and that are generated by the S supernodes that are separated by a predetermined supernode distance.

In another feature, a distance between the derived symbols that are selected from the S*d derived symbols is equal to the predetermined supernode distance multiplied by d.

In another feature, the method further comprises generating the quasi-cyclic irregular LDPC code based on the quasi-cyclic parity check matrix.

In another feature, the method further comprises joining the quasi-cyclic parity check matrix and a square quasi-cyclic matrix.

In another feature, the square quasi-cyclic matrix is an identity matrix.

In another feature, the square quasi-cyclic matrix comprises circulant matrices of the same size.

In another feature, the circulant matrices have a row weight and a column weight equal to 1.

In another feature, a row weight and a column weight of a last of the circulant matrices are equal to 2.

In another feature, the quasi-cyclic parity check matrix is a sparse matrix.

In still other features, a code selection method comprises the method and further comprises generating a plurality of quasi-cyclic irregular LDPC codes.

In another feature, the code selection method further comprises decoding the LDPC codes, and determining error-correcting ability of the LDPC codes by calculating at least one of burst correction power and girth of the LDPC codes.

In another feature, the code selection method further comprises calculating the girth based on Tanner graphs constructed using the S*d derived symbols.

In another feature, the code selection method further comprises selecting bursts of M consecutive symbols from a data block encoded by one of the LDPC codes, where M is an integer at least equal to 1.

In another feature, the code selection method further comprises inputting incorrect log-likelihood ratios (LLRs) for the M consecutive symbols and determining whether the data block is correctly decoded.

In another feature, the code selection method further comprises determining the burst correction power of the one of the LDPC codes as a value of M when the data block cannot be correctly decoded.

In still other features, a device comprises supernode generator means for generating S supernodes each comprising d symbol nodes, where S and d are integers greater than 1. The device further comprises supernode splitting means for splitting each of the S supernodes into d derived symbols, wherein a total number of symbol edges of the d derived symbols is equal to a predetermined number of symbol edges of each of the S supernodes. The device further comprises control means for generating a quasi-cyclic irregular low density parity check (LDPC) code based on S*d derived symbols, wherein S equals the S supernodes and d equals the d derived symbols.

In another feature, the supernode generator means receives data that includes n symbol nodes each having symbol edges that connect the n symbol nodes to r check nodes, where n and r are integers greater than 1 and n=S*d.

In another feature, the supernode generator means selects the d symbol nodes from the n symbol nodes and groups the d symbol nodes in each of the S supernodes, and wherein a sum of symbol edges of the d symbol nodes is the same for each of the S supernodes.

In another feature, every $P^{th}$ derived symbol generated by the S supernodes that are separated by a predetermined supernode distance has the same number of symbol edges, where P is an integer and $1 \leq P \leq d$.

In another feature, the d derived symbols connect to the r check nodes with the predetermined number of symbol edges, where r is an integer greater than 1.

In another feature, the control means performs a permutation of the predetermined number of symbol edges of the S*d derived symbols and check node edges of r check nodes using a permutation polynomial, where r is an integer greater than 1. The control means generates an irregular LDPC code based on the permutation.

In another feature, the control means generates a parity check matrix, wherein columns of the parity check matrix comprise the S*d derived symbols and rows of the parity check matrix comprise r check nodes, where r is an integer greater than 1.

In another feature, the control means performs permutations of columns and rows of the parity check matrix and generates a quasi-cyclic parity check matrix.

In another feature, the quasi-cyclic parity check matrix comprises submatrices that are circulant matrices.

In another feature, each of the circulant matrices comprises derived symbols that are selected from the S*d derived symbols, that have the same number of symbol edges, and that are generated by the S supernodes that are separated by a predetermined supernode distance.

In another feature, a distance between the derived symbols that are selected from the S*d derived symbols is equal to the predetermined supernode distance multiplied by d.

In another feature, the control means generates the quasi-cyclic irregular LDPC code based on the quasi-cyclic parity check matrix.

In another feature, the control means joins the quasi-cyclic parity check matrix and a square quasi-cyclic matrix.

In another feature, the square quasi-cyclic matrix is an identity matrix.

In another feature, the square quasi-cyclic matrix comprises circulant matrices of the same size.

In another feature, the circulant matrices have a row weight and a column weight equal to 1.

In another feature, a row weight and a column weight of a last of the circulant matrices are equal to 2.

In another feature, the quasi-cyclic parity check matrix is a sparse matrix.

In still other features, a system comprises the device, wherein the device generates a plurality of quasi-cyclic irregular LDPC codes.

In another feature, the system further comprises decoder means for communicating with the device and for decoding the LDPC codes and code selection means for communicating with the decoder means and for determining error-correcting ability of the LDPC codes by calculating at least one of burst correction power and girth of the LDPC codes.

In another feature, the code selection means calculates the girth based on Tanner graphs constructed using the S*d derived symbols.

In another feature, the system further comprises burst selection means for selecting bursts of M consecutive symbols from a data block encoded by one of the LDPC codes, where M is an integer at least equal to 1.

In another feature, the code selection means inputs incorrect log-likelihood ratios (LLRs) for the M consecutive symbols to the decoder means and determines whether the decoder means correctly decodes the data block.

In another feature, the code selection means determines the burst correction power of the one of the LDPC codes as a value of M when the decoder means fails to decode the data block.

In still other features, a computer program executed by a processor comprises generating S supernodes each comprising d symbol nodes, where S and d are integers greater than 1. The computer program further comprises splitting each of the S supernodes into d derived symbols, wherein a total number of symbol edges of the d derived symbols is equal to a predetermined number of symbol edges of each of the S supernodes. The computer program further comprises generating a quasi-cyclic irregular low density parity check (LDPC) code based on S*d derived symbols, wherein S equals the S supernodes and d equals the d derived symbols.

In another feature, the computer program further comprises receiving data that includes n symbol nodes each having symbol edges that connect the n symbol nodes to r check nodes, where n and r are integers greater than 1 and n=S*d.

In another feature, the computer program further comprises selecting the d symbol nodes from the n symbol nodes and grouping the d symbol nodes in each of the S supernodes, and wherein a sum of symbol edges of the d symbol nodes is the same for each of the S supernodes.

In another feature, every $P^{th}$ derived symbol generated by the S supernodes that are separated by a predetermined supernode distance has the same number of symbol edges, where P is an integer and $1 \leq P \leq d$.

In another feature, the d derived symbols connect to the r check nodes with the predetermined number of symbol edges, where r is an integer greater than 1.

In another feature, the computer program further comprises performing a permutation of the predetermined number of symbol edges of the S*d derived symbols and check node edges of r check nodes using a permutation polynomial, where r is an integer greater than 1.

In another feature, the computer program further comprises generating an irregular LDPC code based on the permutation.

In another feature, the computer program further comprises generating a parity check matrix, wherein columns of the parity check matrix comprise the S*d derived symbols and rows of the parity check matrix comprise r check nodes, where r is an integer greater than 1.

In another feature, the computer program further comprises performing permutations of columns and rows of the parity check matrix and generating a quasi-cyclic parity check matrix.

In another feature, the quasi-cyclic parity check matrix comprises submatrices that are circulant matrices.

In another feature, each of the circulant matrices comprises derived symbols that are selected from the S*d derived symbols, that have the same number of symbol edges, and that are generated by the S supernodes that are separated by a predetermined supernode distance.

In another feature, a distance between the derived symbols that are selected from the S*d derived symbols is equal to the predetermined supernode distance multiplied by d.

In another feature, the computer program further comprises generating the quasi-cyclic irregular LDPC code based on the quasi-cyclic parity check matrix.

In another feature, the computer program further comprises joining the quasi-cyclic parity check matrix and a square quasi-cyclic matrix.

In another feature, the square quasi-cyclic matrix is an identity matrix.

In another feature, the square quasi-cyclic matrix comprises circulant matrices of the same size.

In another feature, the circulant matrices have a row weight and a column weight equal to 1.

In another feature, a row weight and a column weight of a last of the circulant matrices are equal to 2.

In another feature, the quasi-cyclic parity check matrix is a sparse matrix.

In still other features, a code selection computer program stored on a tangible computer-medium and executed by a processor, comprises the computer program and further comprises generating a plurality of quasi-cyclic irregular LDPC codes.

In another feature, the code selection computer program further comprises decoding the LDPC codes, and determining error-correcting ability of the LDPC codes by calculating at least one of burst correction power and girth of the LDPC codes.

In another feature, the code selection computer program further comprises calculating the girth based on Tanner graphs constructed using the S*d derived symbols.

In another feature, the code selection computer program further comprises selecting bursts of M consecutive symbols from a data block encoded by one of the LDPC codes, where M is an integer at least equal to 1.

In another feature, the code selection computer program further comprises inputting incorrect log-likelihood ratios (LLRs) for the M consecutive symbols and determining whether the data block is correctly decoded.

In another feature, the code selection computer program further comprises determining the burst correction power of the one of the LDPC codes as a value of M when the data block cannot be correctly decoded.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 12 is a table for interleaver address generation according to the present disclosure;

DETAILED DESCRIPTION

Figure 1:
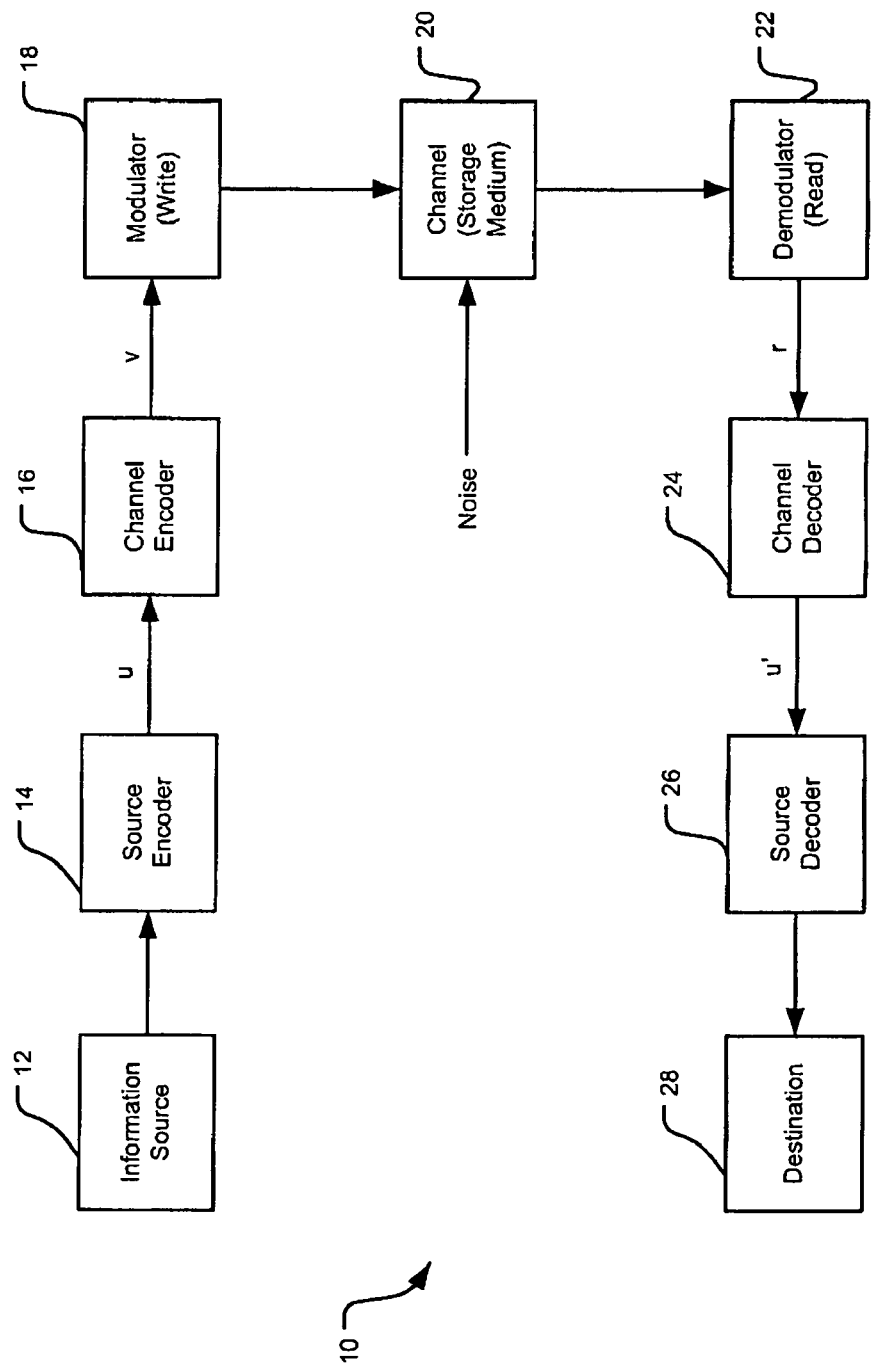
FIG. 1 is a block diagram of an exemplary data communication (or storage) system according to the prior art.
Figure 2:
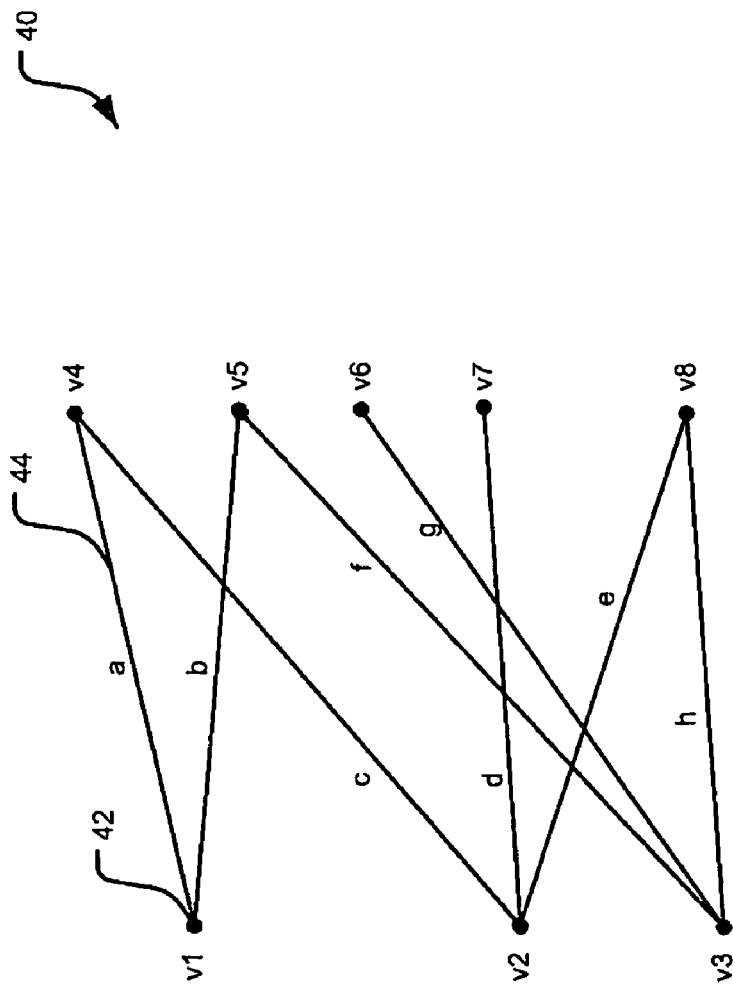
FIG. 2 is a Tanner graph of an exemplary linear code according to the prior art.

The following description is merely exemplary in nature and is in no way intended to limit the present disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 3:
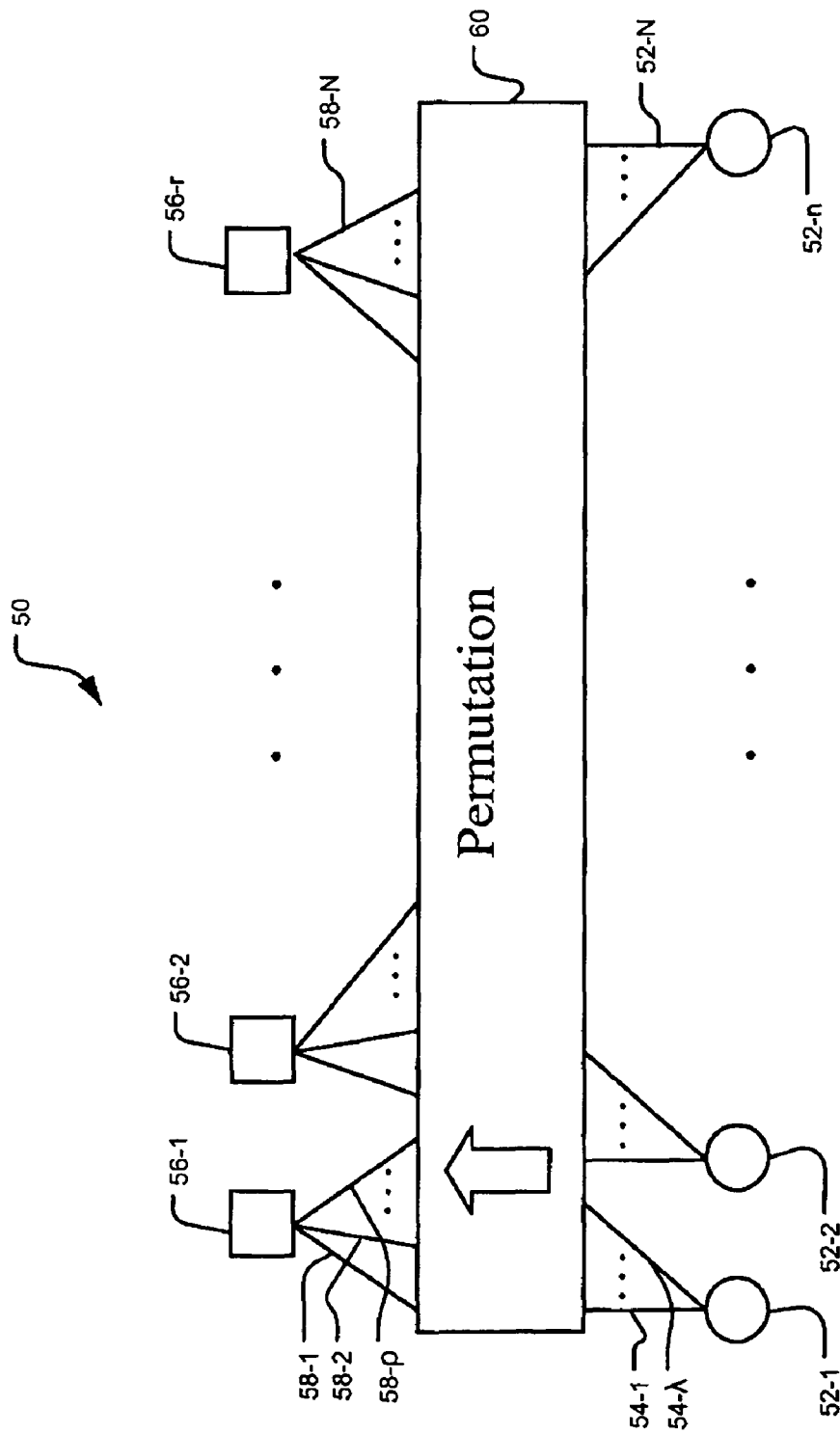
FIG. 3 is a schematic representation of a regular low density parity check (LDPC) code.
Figure 4:
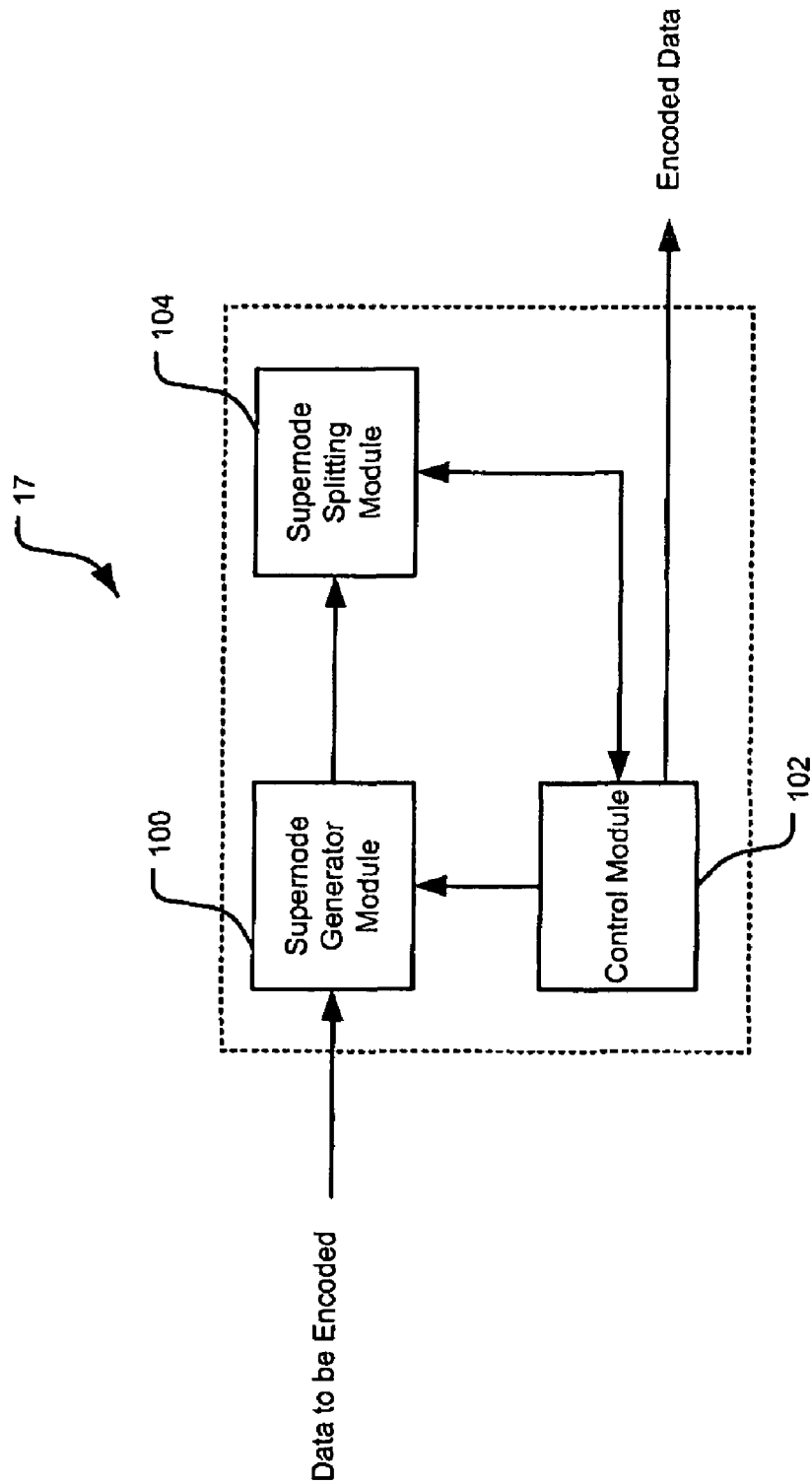
FIG. 4 is a block diagram of an exemplary encoder system for generating quasi-cyclic irregular LDPC codes according to the present disclosure.

Referring now to FIG. 3, a regular low density parity check (LDPC) code 50 comprises n symbol nodes 52-1, 52-2, ..., 52-$n$ (collectively symbol nodes 52). Each one of the symbol nodes 52 has a degree $\lambda$. That is, each one of the symbol nodes 52 has edges 54-1, 54-2, ..., 54-$\lambda$ (collectively edges 54). For clarity, edges 54 of symbol nodes 52 may also be referred to as symbol node edges 54 or symbol edges 54.

Additionally, the regular LDPC code 50 comprises r check nodes 56-1, 56-2, ..., 56-$r$ (collectively check nodes 56). Each one of the check nodes 56 has a degree $\rho$. That is, each one of the check nodes 56 has edges 58-1, 58-2, ..., 58-$\rho$ (collectively edges 58). For clarity, edges 58 of check nodes 56 may also be referred to as check node edges 58.

A total number of edges is given by $N=n\lambda=r\rho$. That is, the n symbol nodes 52 have a total of N edges (i.e., 54-1, 54-2, ..., 54-N), and the r check nodes 56 have a total of N edges (i.e., 58-1, 58-2, ..., 58-N).

Edges emanating from a first symbol node 52-1 may be labeled as $x=0, 1, \ldots, \lambda-1$ (i.e., 54-1, 54-2, ..., 54-$\lambda$, respectively). Similarly, edges emanating from a second symbol node 52-2 may be labeled as $x=\lambda, \lambda+1, \ldots, 2\lambda-1$, etc. Finally, edges emanating from a last symbol node 52-$n$ may be labeled as $x=N-\lambda, N-\lambda+1, \ldots, N-1$. A sum of edges 54 of all n symbol nodes 52 is N.

Similarly, edges emanating from a first check node 56-1 may be labeled as $y=0, 1, \ldots, \rho-1$ (i.e., 58-1, 58-2, ..., 58-$\rho$, respectively). Edges emanating from a second check node 56-2 may be labeled as $y=\rho, \rho+1, \ldots, 2\rho-1$, etc. Finally, edges emanating from a last check node 56-$r$ may be labeled as $y=N-\rho, N-\rho+1, \ldots, N-1$. A sum of edges 58 of all r check nodes 56 is N.

A connection of edges between check nodes 56 and symbol nodes 52 is given by a permutation 60. The permutation 60 is mathematically represented by a polynomial $f(x)=f1*x+f2*x^2$. The permutation polynomial generates a quasi-cyclic regular LDPC code by selecting proper values of polynomial coefficients f1 and f2. Values of f1 and f2 can be selected based on criteria such as girth, minimum distance, etc.

The present disclosure discloses methods for generating quasi-cyclic irregular LDPC codes using supernodes. A supernode is a group of collection of symbol nodes. Symbol nodes in a supernode may have varying degrees. Referring now to FIGS. 4-7, an encoder module 17 generates an irregular LDPC code 101 as follows. The encoder module 17 shown in FIG. 4 comprises a supernode generator module 100, a control module 102, and a supernode splitting module 104.

Figure 5:
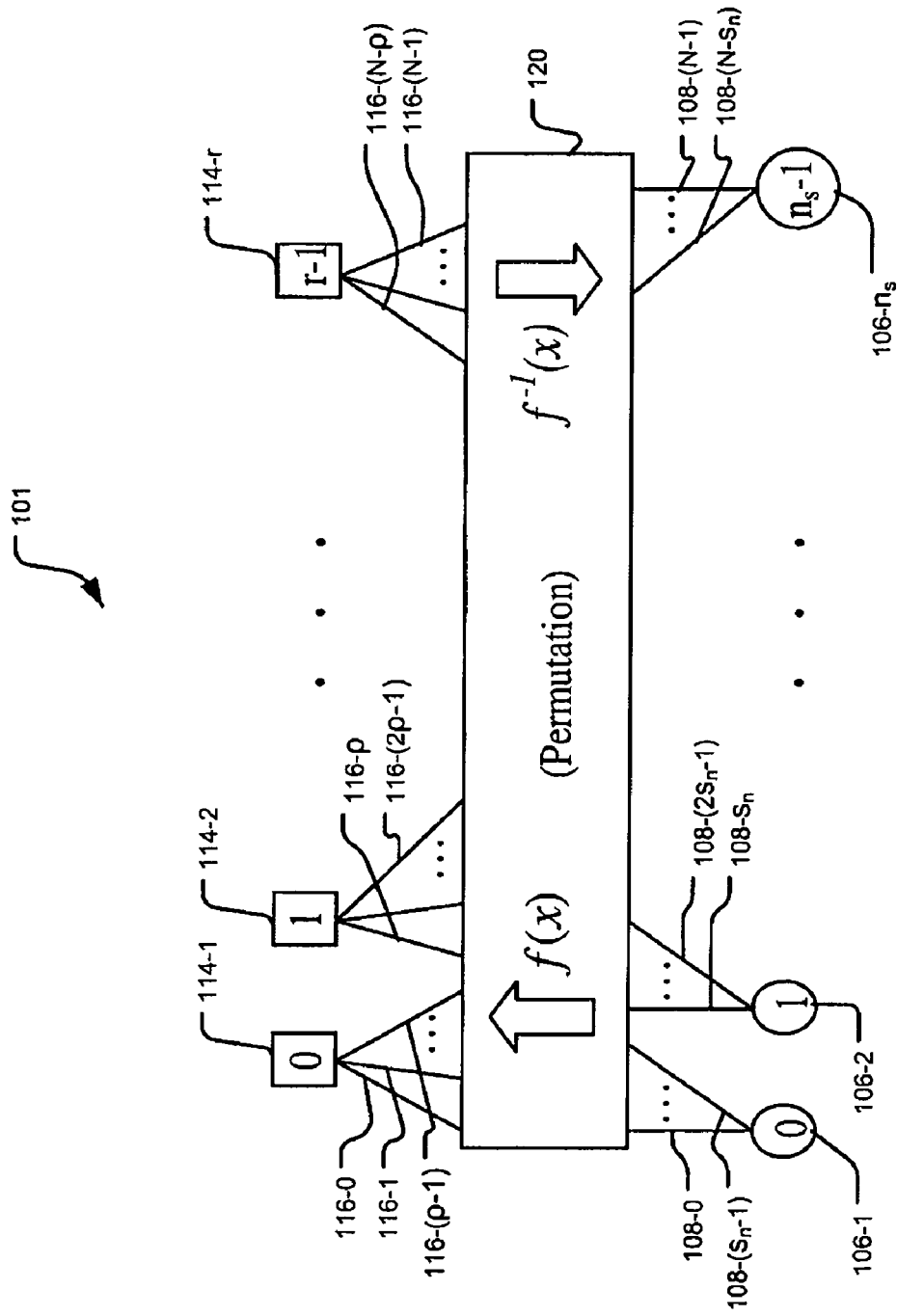
FIG. 5 is a schematic representation of an irregular LDPC code according to the present disclosure.

The supernode generator module 100 generates $n_s$ supernodes 106-1, 106-2, ..., 106-$n_s$ (collectively supernodes 106) of degree $s_n$ as shown in FIG. 5. Each supernode 106 has the same degree $s_n$. That is, each supernode 106 has $s_n$ edges. For example, a first supernode 106-1 has edges 108-0, ..., 108-$(s_n-1)$. A second supernode 106-2 has edges 108-$s_n$, 108-$(2s_n-1)$. An $n_s^{th}$ supernode has edges 108-$(N-s_n)$, ..., 108-$(N-1)$. Thus, the $n_s$ supernodes 106 have a total number of edges 108-0, 108-1, ..., 108-$(N-1)$ (collectively edges 108) equal to N.

Each supernode 106 comprises $d_s$ symbol nodes. Symbol nodes in a supernode 106 may have different degrees. Each supernode 106 generates $d_i$ derived symbols 110 when the supernode 106 is split. Each derived symbol has a degree based on a predetermined supernode degree distribution of each supernode. Each supernode 106 has identical supernode degree distribution. The control module 104 determines a number of symbol nodes $d_i$ per supernode 106, the degree $s_n$ of the supernodes 106, and a supernode degree distribution $D_s$ of the supernodes 106.

Thus, if $d_i$ denotes the number of symbol nodes grouped into a supernode $S_i$ 106 and $s_{ni}$ denotes a number of edges 108 connected to the supernode $S_i$ 106, then $$\Sigma_{i=1}^{ns} d_i = n \text{ and } \Sigma_{i=1}^{ns} s_{ni} = N.$$

If a degree distribution of the supernode $S_i$ 106 is denoted by $D_{Si} = \{n_{i1}, n_{i2}, n_{id}\}$, where $n_{ij}$ denotes a degree of a symbol j in the supernode $S_i$ 106, then $$\Sigma_{j=1}^{di} n_{ij} = s_{ni}.$$

Since all supernodes 106 have identical degree distribution, index i is hereinafter omitted. Thus, the supernode degree distribution is denoted by $D_s$, and the number of symbol nodes grouped into each supernode 106 is denoted by d.

Additionally, the irregular LDPC code 101 comprises r check nodes 114-1, 114-2, . . . , 114-r (collectively check nodes 114) as shown in FIG. 5. The check nodes 114 have a degree ρ. That is, each check node 114 has ρ edges. For example, a first check node 114-1 has edges 116-0, 116-1, . . . , 116-(ρ−1). A second check node 114-2 has edges 116-ρ, . . . , 116-(2ρ−1). A $r^{th}$ check node has edges 116-(N−ρ), . . . , 116-(N−1). Thus, the r check nodes 114 have a total number of edges 116-0, . . . , 116-(N−1) (collectively edges 116) equal to N, where N=rρ.

Figure 6:
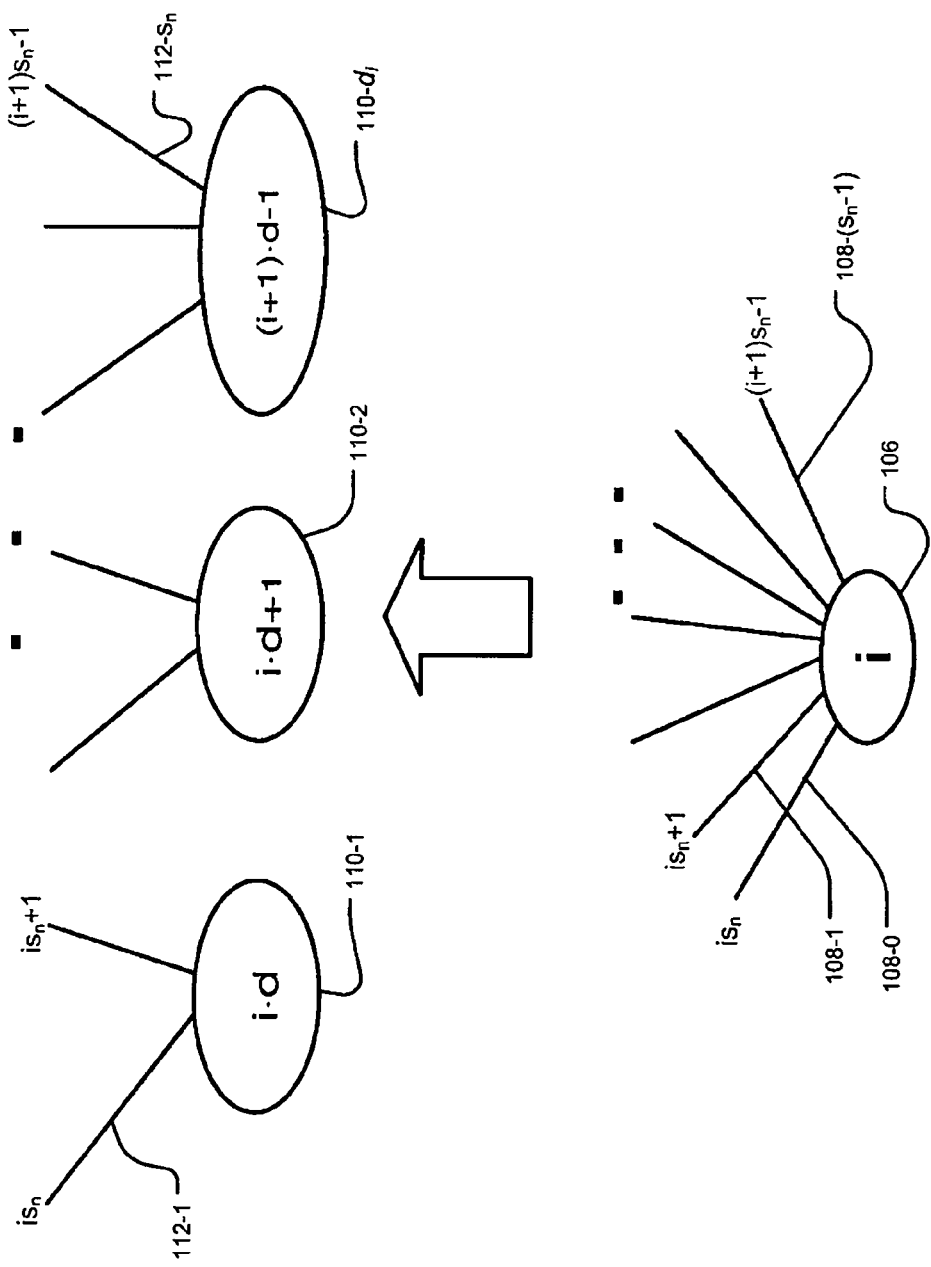
FIG. 6 is a schematic representation of generating derived symbols by splitting supernodes according to the present disclosure.

The irregular LDPC code 101 is obtained by splitting supernodes 106 into symbol nodes 110 as shown in FIG. 6. The supernode splitting module 104 splits the supernodes 106 into derived symbols 110. Specifically, each supernode 106 produces d derived symbols 110. Each derived symbol 110 can have different degrees and thus different number of edges according to the supernode degree distribution $D_s$. A total number of edges 112-1, . . . , 112-$s_n$ (collectively edges 112) of all derived symbols 110 generated by each supernode 106 is equal to $s_n$, which is equal to the number of edges of each supernode 106.

Figure 7:
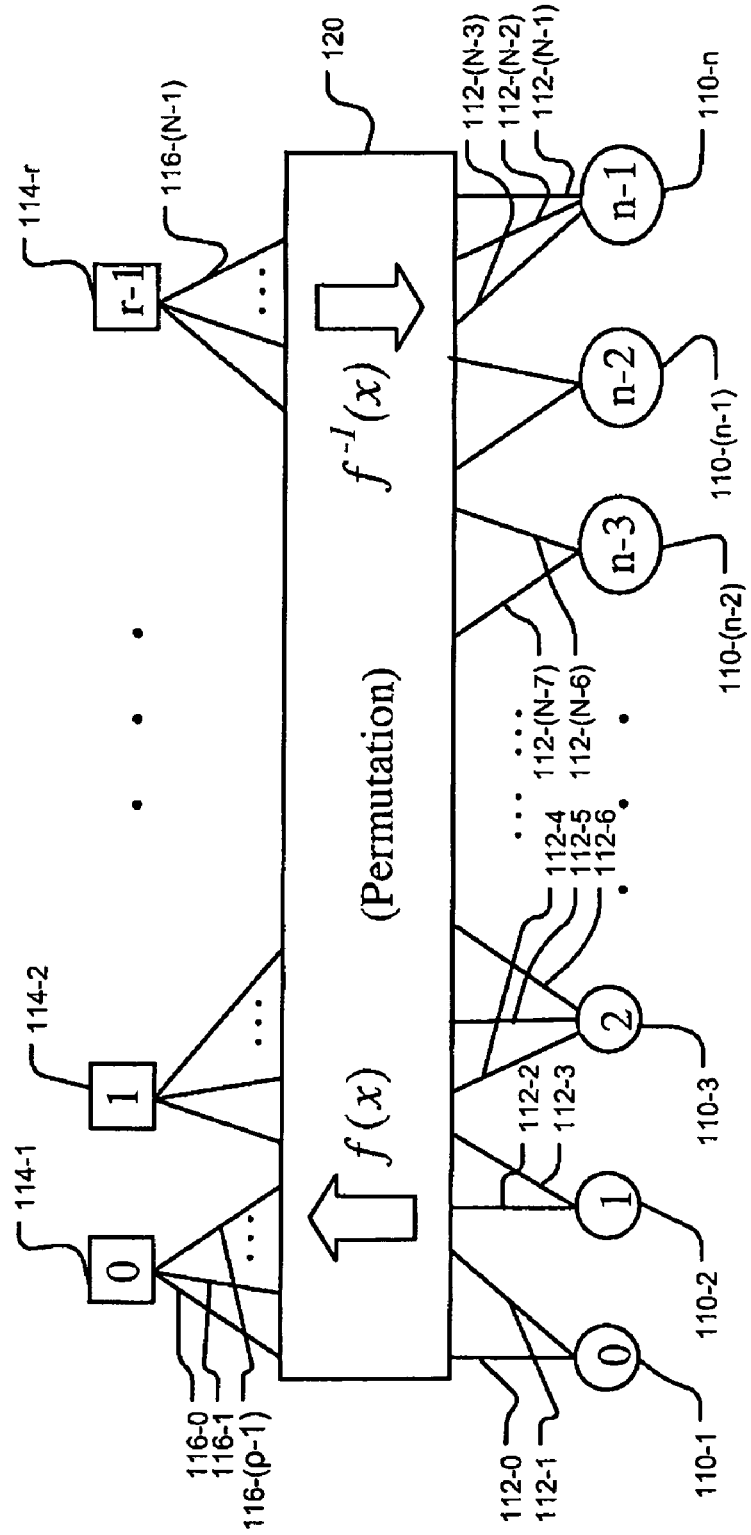
FIG. 7 is a schematic representation of an exemplary irregular LDPC code according to the present disclosure.

FIG. 7 shows an exemplary irregular LDPC code obtained by supernode splitting where d=3, $s_n$=7, and $D_s$={2, 2, 3}. Since the control module 102 selects d=3, the supernode generating module 100 generates each supernode 106 comprising three symbol nodes. Each supernode 106 has seven edges as denoted by a supernode degree of $s_n$=7.

The supernode splitting module 104 splits each supernode 106 into three derived symbols 110. For example, derived symbols 110-1, 110-2, and 110-3 are generated by splitting a first supernode 106-1. Similarly, derived symbols 110-(n−2), 110-(n−1), and 110-n are generated by splitting $n^{th}$ supernode 106-$n_s$.

Derived symbols 110-1, 110-2, and 110-3 have a degree distribution of $D_s$={2, 2, 3} specified by the control module 104. Thus, derived symbol 110-1 has a degree of 2 and two edges 112-0 and 112-1. Derived symbol 110-2 has a degree of 2 and two edges 112-2 and 112-3. Derived symbol 110-3 has a degree of 3 and three edges 112-4, 112-5, and 112-6.

Similarly, derived symbol 110-(n−2) has a degree of 2 and two edges 112-(N−7) and 112-(N−6). Derived symbol 110-(n−1) has a degree of 2 and two edges 112-(N−5) and 112-(N−4). Derived symbol 110-n has a degree of 3 and three edges 112-(N−3), 112-(N−2), and 112-(N−1).

Thus, a total number of edges of three derived symbols 110 generated by splitting each supernode 106 is equal to seven, which is a sum of components of the degree distribution 2, 2, and 3. The total number of edges of three derived symbols 110 is also equal to the number of edges of each supernode 106 as indicated by the supernode degree of $s_n$=7.

The control module 102 performs a permutation (i.e., a rearrangement) f(X) 120 on N edges 112 of the derived symbols 110 to generate the irregular LDPC code 101. Generally, the permutation 120 may be expressed by a permutation polynomial y=f(x), where x is an edge label of derived symbols 110, and y is an edge label of check nodes 114. Thus, connections between derived symbols 110 and check nodes 114 may be determined by the permutation polynomial y=f(x).

Theoretically, multiple permutation polynomials may generate multiple permutations and, in turn, may generate multiple irregular LDPC codes. For example, the permutation f(x) may be represented by a permutation polynomial $f(x)=f1*x+f2*x^2$. Multiple permutations and multiple codes may be generated depending on values of polynomial coefficients f1 and f2. A code that performs best in a noisy environment may be selected from the multiple codes.

Generally, performance of a code may be measured by measuring an ability of the code to decode symbols correctly despite errors caused by noise. Performance of a code typically depends on parameters such as girth, minimum distance, burst correction power, etc., of the code. Thus, girth, minimum distance, burst error correction, etc., may be used to determine optimum values of f1 and f2.

For example, the control module 102 may calculate girths of Tanner graphs of multiple codes that may be generated using different values of f1 and f2. The control module 102 calculates girths of Tanner graphs constructed using the derived symbols 110. The control module 102 selects values of f1 and f2 that correspond to the Tanner graph having maximum girth as the optimum values of f1 and f2. Thereafter, the encoder module 17 generates the irregular LDPC code 101 using the selected values of f1 and f2.

Figure 8:
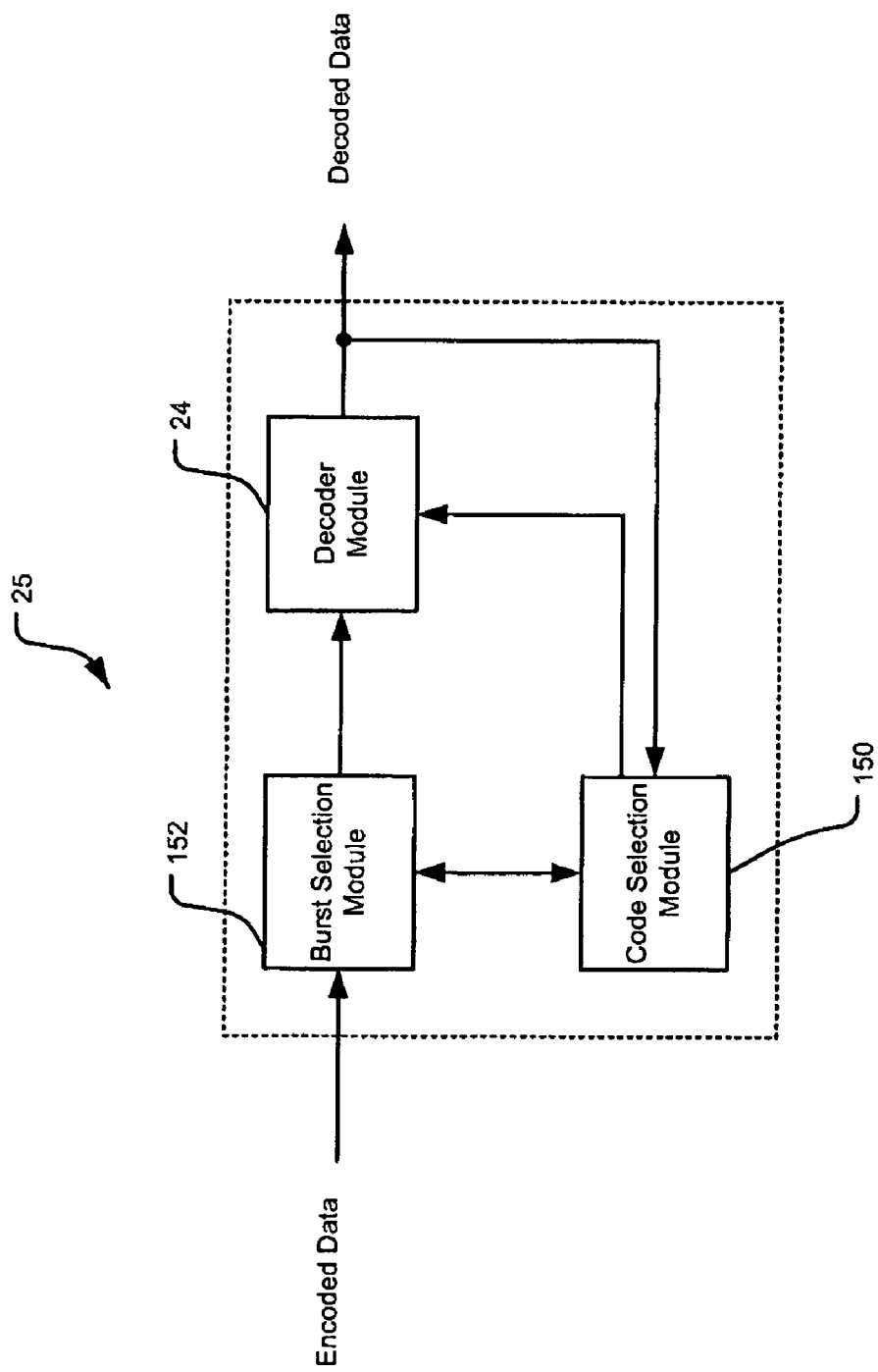
FIG. 8 is a block diagram of an exemplary system for determining error-correcting ability of a code according to the present disclosure.

Alternatively, the encoder module 17 may generate the irregular LDPC code 101 based on the burst correction power of the code 101. Referring now to FIG. 8, a performance measuring system 25 calculates the burst correction power M of multiple irregular LDPC codes 101 as follows. The performance measuring system 25 comprises a code selection module 150, a burst selection module 152, and a decoder module 24. The code selection module 150 initially sets M=1.

The burst selection module 152 receives data that is encoded using an irregular LDPC code 101. The burst selection module 152 selects a burst, that is, a set of first M consecutive symbols (e.g., symbol 1 to symbol M) from an encoded data block. The code selection module 150 inputs incorrect log-likelihood ratios (LLRs) for the symbols in the burst to the decoder module 24. LLRs are set to zero for erasures.

Assuming LLRs for the remaining symbols in the encoded data block are correct, the code selection module 150 checks if the decoder module 24 correctly decodes the encoded data block although the burst has incorrect LLRs. If the decoder module 24 correctly decodes the encoded data block, the burst selection module 152 selects a second set of M consecutive symbol (i.e., symbol 2 to symbol M+1). The code selection module 150 inputs incorrect LLRs for the symbols to the decoder module 24, and the decoder module 24 decodes the encoded data block, etc.

The decoder module 24 decodes the encoded data block for all possible sets of M consecutive symbols in the encoded data block. If the decoder module 24 correctly decodes the encoded data block, the code selection module 150 increments M, and decoding is repeated until a value of M is found for which the decoder module 24 fails to correctly decode the encoded data block. That value of M is called the burst correction power of the irregular LDPC code 101.

The code selection module 150 determines the burst correction power of multiple irregular LDPC codes and selects the irregular LDPC code having the highest burst correction power. The encoder module 17 may be implemented to generate the irregular LDPC code having the highest burst correction power.

Implementing encoders can be simplified if a parity check matrix of an irregular LDPC code can be written in a quasi-cyclic form. This is because a matrix in quasi-cyclic form comprises circulants of the same size, which can be efficiently stored in memory. For example, only a first row of each circulant in a quasi-cyclic matrix may be stored in memory. Additionally, if the circulants are sparse matrices, only positions of 1's in first row/column may be stored.

A quasi-cyclic parity check matrix of the irregular LDPC code 101 is obtained as follows. The control module 102 permutes (i.e., rearranges) rows and columns of a parity check matrix H of the irregular LDPC code 101 wherein rows of H comprise check nodes 114, and columns of H comprise derived symbols 110. Specifically, derived symbols 110 with same degree belonging to supernodes 106 that are separated by a supernode-distance $\beta_s$ are placed adjacent to each other in same circulant in a permuted matrix H'. The supernode distance $\beta_s$ is a permuation parameter for supernodes 106.

For example, if supernode distance $\beta_s=1$, assuming each supernode 106 generates three derived symbols, supernode 106-1 may generate derived symbols 110-1, 110-2, and 110-3. Similarly, supernode 106-2 may generate derived symbols 110-4, 110-5, and 110-6, etc. In that case, degrees of derived symbols 110-1, 110-4, etc., will be identical. Similarly, degrees of derived symbols 110-2, 110-5, etc., will be identical, etc. The derived symbols 110-1, 110-4, etc. may be placed in a first circulant. Similarly, derived symbols 110-2, 110-5, etc. may be placed in a second circulant, etc.

The supernode distance $\beta_s$, however, may be greater than 1. For example, if $\beta_s=4$, assuming each supernode 106 generates three derived symbols, supernode 106-1 may generate derived symbols 110-1, 110-2, and 110-3. Similarly, supernode 106-5 may generate derived symbols 110-13, 110-4, and 110-15, etc. In that case, degrees of derived symbols 110-1, 110-13, etc., will be identical. Similarly, degrees of derived symbols 110-2, 110-14, etc., will be identical, etc.

Since the derived symbols 110-1, 110-13, etc. are separated by the same supernode distance $\beta_s=4$, the derived symbols 110-1, 110-13, etc. may be placed in a first circulant. Similarly, since the derived symbols 110-2, 110-14, etc. are separated by the same supernode distance $\beta_s=4$, the derived symbols 110-2, 110-14, etc. may be placed in a second circulant, etc.

This is mathematically explained as follows. Let GCD(.,.) and LCM(.,.) denote a greatest common divisor and a least common multiplier operations, respectively. We have $$N = \frac{n}{d}\sum_{j=1}^{d} n_j = \frac{n}{d}s_n = r\rho.$$

We define $$u = GDC(2f_2, N),\ G = \frac{N}{u},\ \mu = LCM(G, s_n)\ \text{and}\ t = \frac{u}{s_n}.$$

Then, $\beta_s = mt$ where m is a smallest positive integer such that $\rho$ divides $f(m\mu)$. $\beta_s$ is a distance between supernodes 106. Thus, a distance between derived symbols 110, which belong to same circulant is $\beta = m \cdot s_n = m\mu$.

The control module 102 first performs column (symbol node) permutation of the parity check matrix H, wherein columns of H comprise derived symbols 110. A parity check matrix H" is obtained by setting $$i = \left\lfloor \frac{i'}{\beta} \right\rfloor + k \cdot (i' \bmod \beta),\ i' = 0, 1, \ldots, n$$

where i is the symbol index in H, i' is the symbol index in H", and $k=n/\beta$. After obtaining H", the control module 102 performs row (check node) permutation using a constant $\beta=f(m\mu)/\rho$ instead of $\beta$. This gives a quasi-cyclic matrix H'. Thus, by permuting rows and columns of H, a quasi-cyclic matrix H' with circulant submatrices of dimension k×k is obtained.

Alternatively, the encoder module 17 may generate quasi-cyclic irregular LDPC codes by gluing or joining two quasi-cyclic matrices. Specifically, the control module 102 may generate a parity check matrix H for a quasi-cyclic irregular LDPC code by joining two matrices that are quasi-cyclic. For example,

H=[AB]

where A is a quasi-cyclic parity check matrix of an irregular LDPC code, and B is a square quasi-cyclic matrix defined as follows.

$$B = \begin{bmatrix} 1 & & & & & & & \\ 1 & 1 & & & & & & \\ & 1 & 1 & & & & & \\ & & & \ddots & & & & \\ & & & & \ddots & & & \\ & & & & & \ddots & & \\ & & & & & 1 & 1 & \\ & & & & & & 1 & 1 \\ & & & & & & & 1 & 1 \end{bmatrix}\ \text{or}$$

$$B = \begin{bmatrix} C_1 & & & & & & \\ C_2 & C_3 & & & & & \\ & C_4 & C_5 & & & & \\ & & & \ddots & & & \\ & & & & \ddots & & \\ & & & & & \ddots & \\ & & & & & C_{m-5} & C_{m-4} & \\ & & & & & & C_{m-3} & C_{m-2} \\ & & & & & & & C_{m-1} & C_m \end{bmatrix}$$

where $C_1$ (j=1, 2, . . . , m) are circulants of same size.

Circulants $C_1, C_2, \ldots, C_{m-1}$ have row weight and column weight equal to 1. Circulants $C_1, C_2, \ldots, C_{m-1}$ can be identity matrices. For better code performance, the circulant $C_m$ may have row weight and column weight equal to 2 as shown below.

$$C_m = \begin{bmatrix} 1 & & & & & & 1 \\ 1 & 1 & & & & & \\ & 1 & 1 & & & & \\ & & & \ddots & & & \\ & & & & \ddots & & \\ & & & & & 1 & 1 \\ & & & & & & 1 & 1 \\ & & & & & & & 1 & 1 \end{bmatrix}$$

On the other hand, for easy implementation of an encoder, $C_m$ may have row weight and column weight as shown below.

$$C_m = \begin{bmatrix} 1 & & & & & & \\ 1 & 1 & & & & & \\ & 1 & 1 & & & & \\ & & & \ddots & & & \\ & & & & \ddots & & \\ & & & & & 1 & 1 \\ & & & & & & 1 & 1 \\ & & & & & & & 1 & 1 \end{bmatrix}$$

Encoders that can generate codes specified by H can be easily implemented. This is because information bits x of the codes can be directly transmitted. Additionally, parity bits $p=B^{-1}Ax$ of the codes can be encoded using a multiplication of the sparse matrix A and the input vector x, followed by a backward-substitution implementation of $B^{-1}$.

Figure 9:
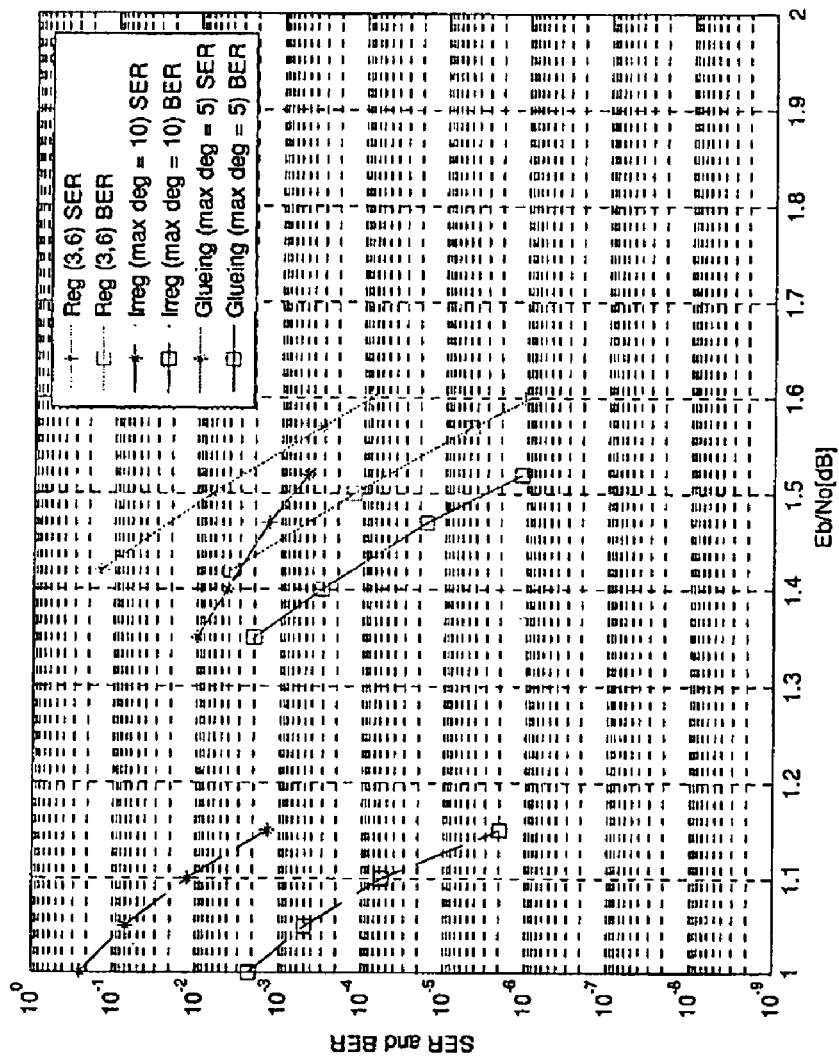
FIG. 9 is a graph of segment error rate (SER) and bit error rate (BER) plotted as a function of signal to noise ratio (SNR=$E_b/N_0$) for a regular LDPC code and irregular LDPC codes generated according to the present disclosure.

FIG. 9 shows simulation results for a regular LDPC code ($\lambda=3$, $\rho=6$), an irregular LDPC code having check node degrees $\rho=7$, and a LDPC code obtaining by gluing matrices. Segment error rate (SER) and bit error rate (BER) for the regular LDPC code, the irregular LDPC code, and the LDPC code obtained by gluing matrices are plotted as a function of signal to noise ratio (SNR=$E_b/N_0$) in a graph.

The graph shows that the irregular LDPC code outperforms the regular LDPC code by approximately 0.4 bB. Other parameters of the irregular LDPC code are d=32, $s_n$=112, $n_s$=1024, and $D_S$={2, 2, 2, 2, 2, 2, 2, 2, 2, 2, 2, 2, 2, 2, 2, 3, 3, 3, 3, 3, 3, 3, 3, 4, 4, 5, 10, 10, 10, 10}. Remaining parameters of the regular LDPC code and the irregular LDPC code are block length (number of symbol nodes) n=32768, number of check nodes r=16384, code rate R=n/k=0.5, and size of circulants T=32.

Additionally, the graph shows performance of the LDPC code obtained by gluing an irregular matrix A and a matrix B given by $$B = \begin{bmatrix} 1 & & & & & & D \\ 1 & 1 & & & & & \\ & 1 & 1 & & & & \\ & & & \ddots & & & \\ & & & & \ddots & & \\ & & & & & 1 & 1 \\ & & & & & & 1 & 1 \\ & & & & & & & 1 & 1 \end{bmatrix}$$

where the irregular matrix A has a maximum symbol degree=5, a minimum symbol degree=2, and a maximum check degree=5, and $$D = \begin{bmatrix} 0 & & & & & & \\ 1 & 0 & & & & & \\ & 1 & 0 & & & & \\ & & & \ddots & & & \\ & & & & \ddots & & \\ & & & & & 1 & 0 \\ & & & & & & 1 & 0 \\ & & & & & & & 1 & 0 \end{bmatrix}.$$

Figure 10:
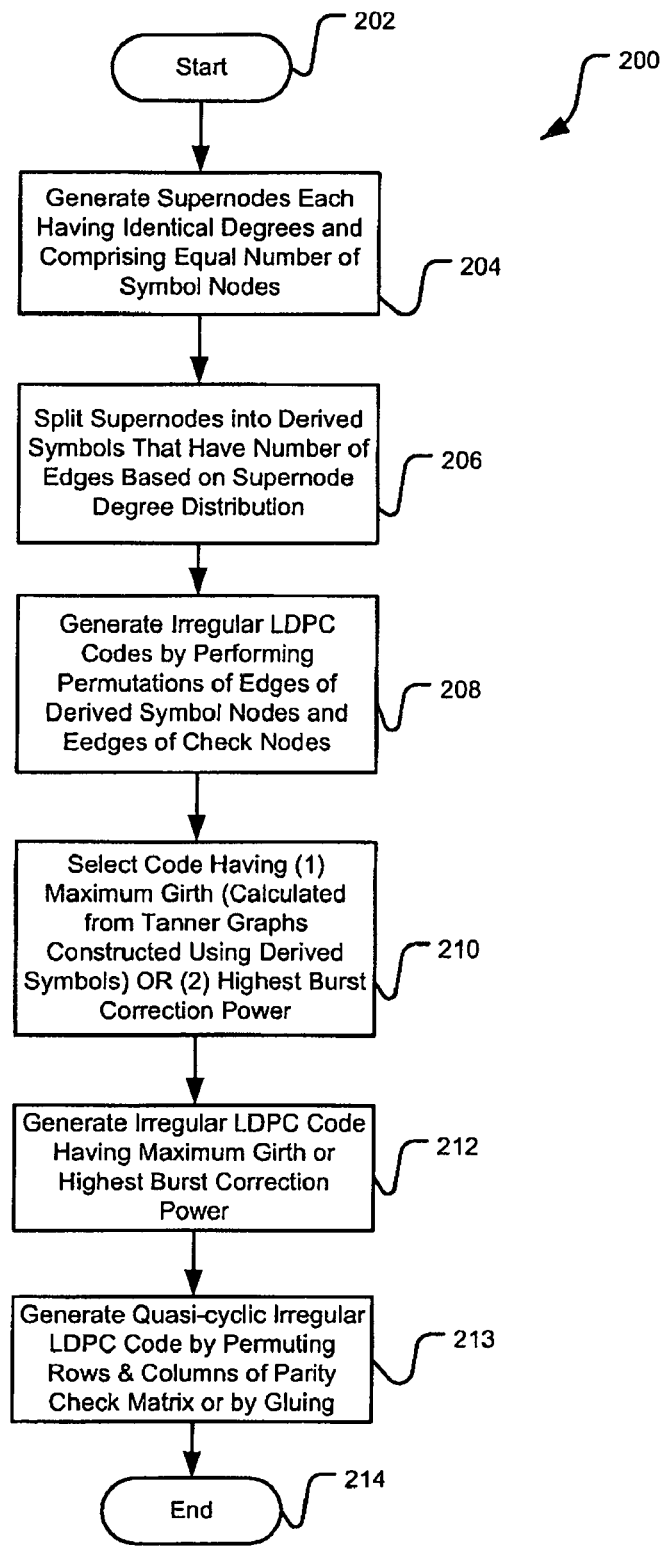
FIG. 10 is a flowchart of a method for generating irregular LDPC codes according to the present disclosure.

Referring now to FIG. 10, a method 200 for generating quasi-cyclic irregular LDPC codes begins at step 202. A supernode generator module 100 generates supernodes 106 in step 204 each having identical degrees and comprising equal number of symbol nodes. A supernode splitting module 104 splits each of the supernodes 106 in step 206 into derived symbols 110. The derived symbols have a number of edges based on a predetermined supernode degree distribution of the supernodes 106.

The control module 102 generates an irregular LDPC code in step 208 by performing a permutation 120 of edges of derived symbols 110 and edges of check nodes 114 using a permutation polynomial. The control module 102 selects an irregular LDPC code having maximum girth or burst correction power or both in step 210. The control module 102 calculates girth of Tanner graph plotted using derived symbols 110. The encoder module 17 generates the irregular LDPC code having maximum girth or burst correction power or both in step 212. The encoder module 17 generates a quasi-cyclic irregular LDPC code by gluing or by permuting (i.e., rearranging) rows and columns of a partiy check matric of the irregular LDPC code 101 in step 213. The method 200 ends in step 214.

Figure 11:
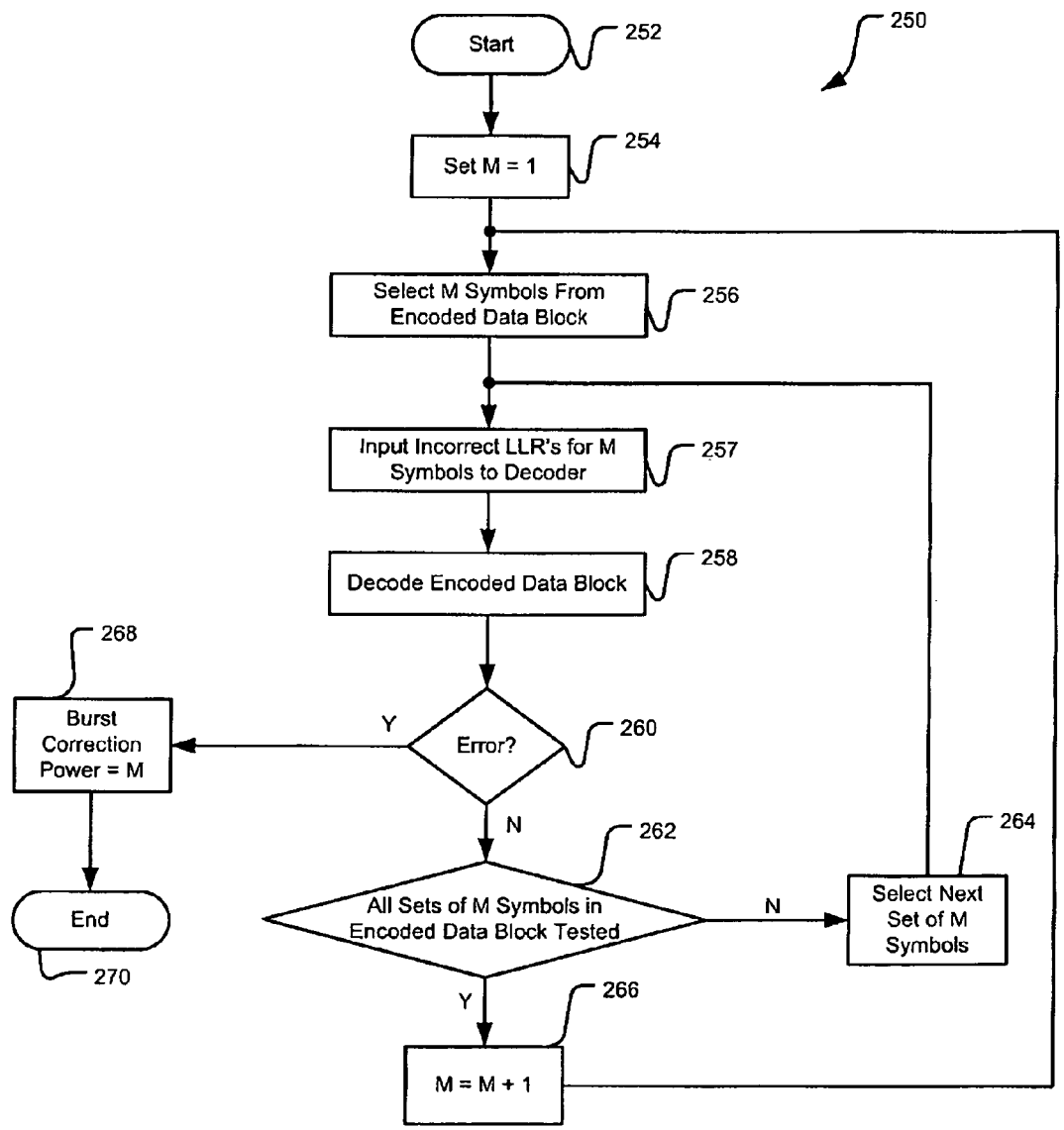
FIG. 11 is a flowchart of a method for measuring a burst correction power of irregular LDPC codes generated according to the present disclosure.

Referring now to FIG. 11, a method 250 for determining a burst correction power M of an irregular LDPC code begins at step 252. A code selection module 150 initializes M as M=1 in step 254. A burst selection module 152 selects a burst, that is, a set of M symbols (e.g., symbol 1 to symbol M) from an encoded data block in step 256. The code selection module 150 inputs incorrect log-likelihood ratios (LLRs) for the M symbols to the decoder module 24 in step 257. The decoder module 24 decodes the encoded data block in step 258.

The code selection module 150 determines in step 260 whether the decoder module 24 correctly decoded data. If true, the code selection module 150 determines in step 262 whether all sets of M symbols in the encoded data block are tested. If false, the burst selection module 152 selects a next set of M symbols (e.g., symbol 2 to symbol M+1) from the encoded data block in step 264, and steps 257 through 264 are repeated.

When the decoder module 24 correctly decodes the encoded data block for all sets of M symbols, the code selection module 150 increments M by 1 in step 266. Steps 256 through 266 are repeated until the decoder module 24 fails to decode the encoded data block in step 260. When the decoder module 24 fails, the code selection module 150 determines in step 268 that the burst correction power of the irregular LDPC code is that value of M for which the decoder module 24 fails. The method 250 ends in step 270.

Referring now to FIG. 12, implementation of an interleaver address generator (not shown) may be simplified when a parity check matrix of an irregular LDPC code is represented in the form of a quasi-cyclic matrix comprising circulants (i.e., k×k submatrices). This is because the interleaver address generator may generate mapping for only a first of each group of k columns. A table in FIG. 12 shows an exemplary implementation of the interleaver address generator, wherein following notations are used.

N Total number of edges, n Number of symbol nodes, r Number of check nodes,

λ degree of symbol nodes for regular codes,

ρ degree of check nodes for both types of codes,

H Original parity check matrix,

H' Quasi-cyclic parity check matrix (H with permuted rows and columns), i Indexing of symbol nodes in H, j Indexing of check nodes in H, i' Indexing of symbol nodes in H', j' Indexing of check nodes in H', x Indexing of edges emanating from symbol nodes, y Indexing of edges emanating from check nodes, β Column shifting between H and H'', and γ Row shifting between H'' and H'.

The interleaver address generation for regular LDPC codes and irregular LDPC codes comprises following steps. A symbol index i' in a permuted quasi-cyclic parity check matrix H' is converted into an index i in an original parity check matrix H. Edge labels x of edges emanating from i are determined. Given x, labels of edges from check node perspective are determined as y=f(x) mod N. Thereafter, values of y are converted to j, which are labels of edges from check nodes in Tanner graph drawn using symbol nodes before permutation. Values of j are then converted to j', which are labels of edges from check nodes that are in the permuted matrix H'.

The steps in interleaver address generation for regular LDPC codes can be mathematically expressed as follows. Mapping i' to i is given by following equations.

$$\text{Let } k = \frac{n}{\beta}, i \left\lfloor \frac{i'}{k} \right\rfloor + \beta(i' \bmod k), i' = 0, 1, \ldots, n$$

i'=0, 1, . . . , n

A list of x values can be calculated from i by using following equations.

$$x_0 = i \cdot \lambda + 0$$

$$x_1 = i \cdot \lambda + 1$$

.

.

.

$$x_{\lambda-1} = i \cdot \lambda + \lambda - 1$$

y is calculated using an interleaving function given by following equation.

$$y = f_1 \cdot x + f_2 \cdot x^2 (\bmod N)$$

j is calculated as follows.

$$j = \left\lfloor \frac{y}{\rho} \right\rfloor$$

j' is calculated using following equations.

$$\text{Let } l = \frac{r}{\gamma}, j' = \left\lfloor \frac{j}{\gamma} \right\rfloor + l \cdot (j \bmod \gamma)$$

Similar steps can be performed in interleaver address generation for irregular LDPC codes, wherein β is replaced by $\beta_s$, and node degree λ is replaced by supernode degree $s_n$.

Figure 13A:
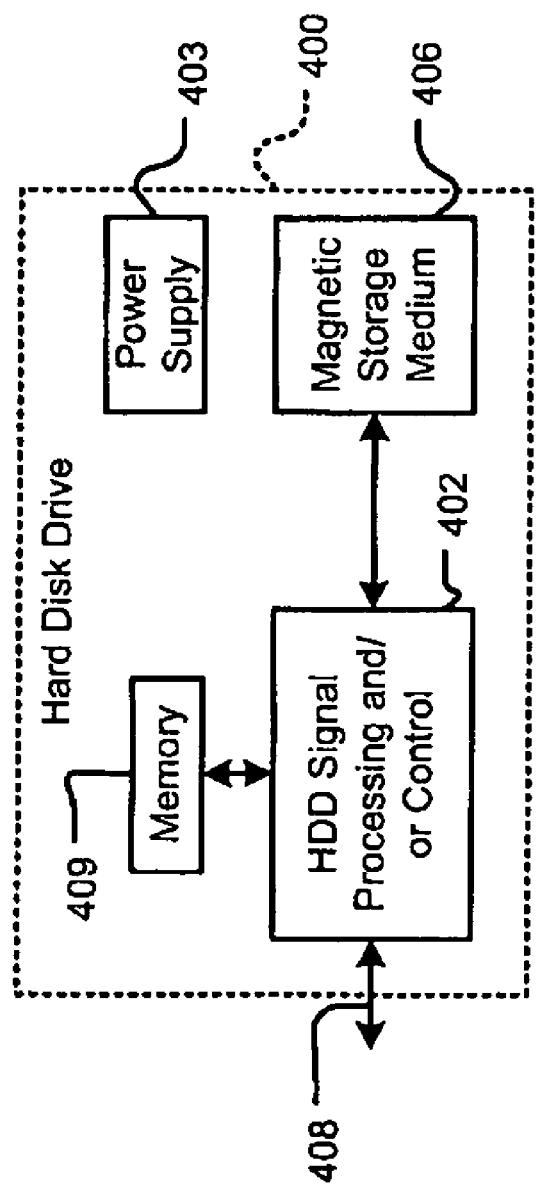
FIG. 13A is a functional block diagram of a hard disk drive.

Referring now to FIGS. 13A-13G, various exemplary implementations of the systems and methods disclosed herein are shown. Referring now to FIG. 13A, the systems and methods disclosed herein can be implemented in a signal processing and/or control circuit 402 of a hard disk drive (HDD) 400. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, a mobile computing device such as a personal digital assistant, a cellular phone, a media or MP3 player, etc. via one or more wireline or wireless communication links 408. The HDD 400 may be connected to memory 409 such as random access memory (RAM), low latency nonvolatile memory such as flash memory, read only memory (ROM), and/or other suitable electronic data storage.

Figure 13C:
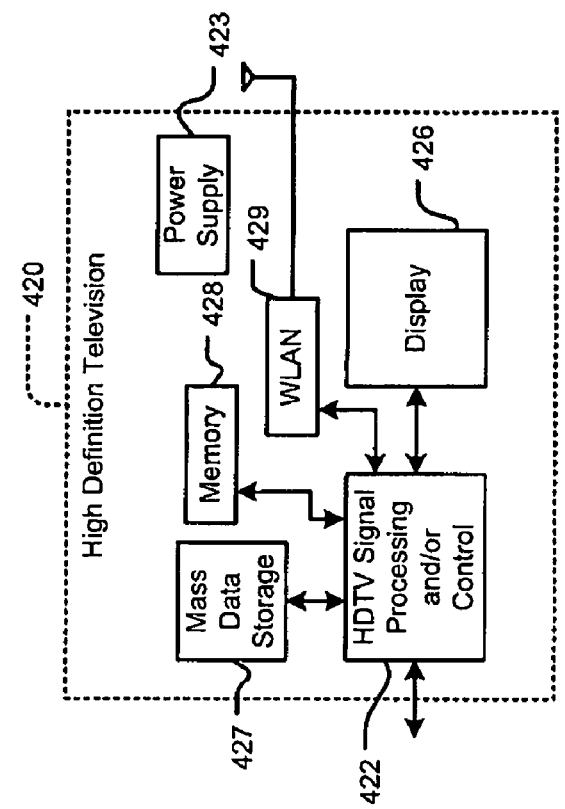
FIG. 13C is a functional block diagram of a high definition television.
Figure 13B:
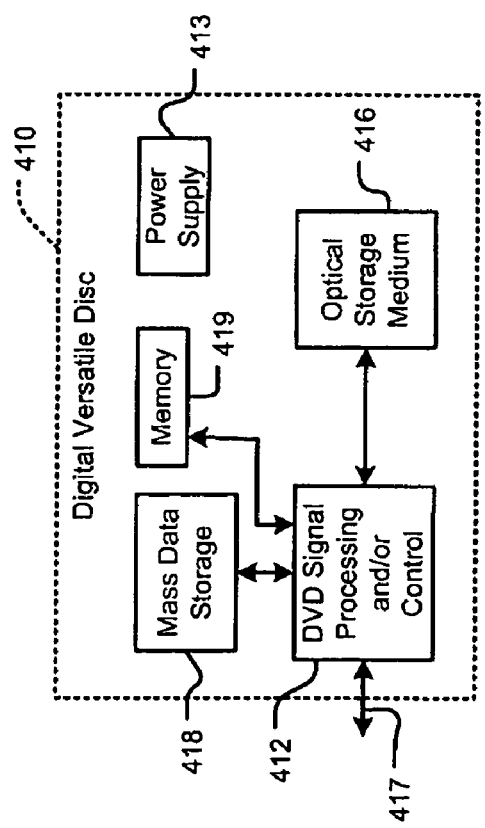
FIG. 13B is a functional block diagram of a digital versatile disk (DVD)

Referring now to FIG. 13B, the systems and methods disclosed herein can be implemented in a signal processing and/or control circuit 412 of a digital versatile disc (DVD) drive 410. In some implementations, the signal processing and/or control circuit 412 and/or other circuits (not shown) in the DVD drive 410 may process data, perform coding and/or encryption, perform calculations, and/or format data that is read from and/or data written to an optical storage medium 416. The signal processing and/or control circuit 412 and/or other circuits (not shown) in the DVD drive 410 may also perform other functions such as encoding and/or decoding and/or any other signal processing functions associated with the DVD drive 410.

The DVD drive 410 may communicate with an output device (not shown) such as a computer, a television or other device via one or more wireline or wireless communication links 417. The DVD drive 410 may communicate with a mass data storage 418 that stores data in a nonvolatile manner. The mass data storage 418 may include a hard disk drive (HDD). The HDD may have the configuration shown in FIG. 13A. The HDD may be a mini HDD that includes one or more platters having a diameter that is smaller than approximately 1.8". The DVD drive 410 may be connected to memory 419 such as RAM, ROM, low latency nonvolatile memory such as flash memory, and/or other suitable electronic data storage.

Referring now to FIG. 13C, the systems and methods disclosed herein can be implemented in a signal processing circuit and/or control circuit 422 of a high definition television (HDTV) 420. The HDTV 420 receives HDTV input signals in either a wireline or a wireless format and generates HDTV output signals for a display 426. In some implementations, the signal processing circuit and/or control circuit 422 and/or other circuits (not shown) of the HDTV 420 may process data, perform coding and/or encryption, perform calculations, format data, and/or perform any other type of processing that the HDTV 420 may require.

The HDTV 420 may communicate with a mass data storage 427 that stores data in a nonvolatile manner and includes optical and/or magnetic storage devices such as hard disk drives (HDDs) and digital versatile disk (DVD) drives. At least one HDD may have the configuration shown in FIG. 13A and/or at least one DVD drive may have the configuration shown in FIG. 13B. The HDD may be a mini HDD that includes one or more platters having a diameter that is smaller than approximately 1.8". The HDTV 420 may be connected to memory 428 such as RAM, ROM, low latency nonvolatile memory such as flash memory, and/or other suitable electronic data storage. The HDTV 420 also may support connections to a WLAN via a WLAN interface 429.

Figure 13E:
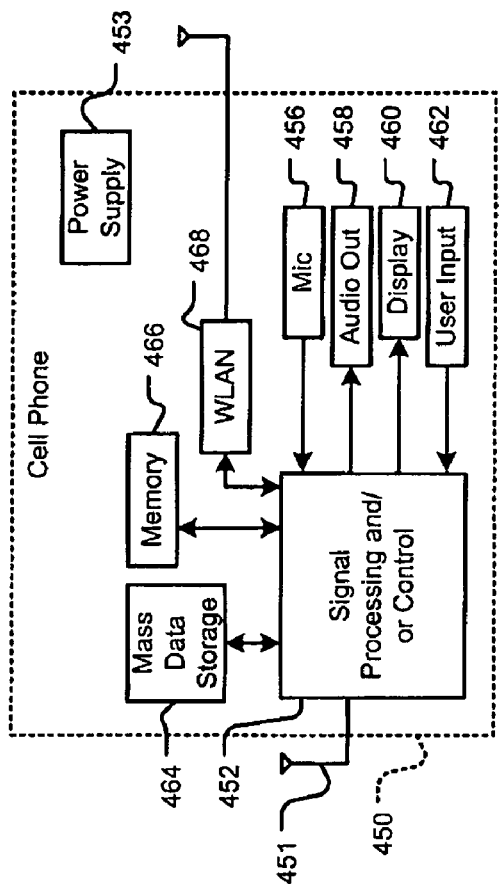
FIG. 13E is a functional block diagram of a cellular phone.
Figure 13D:
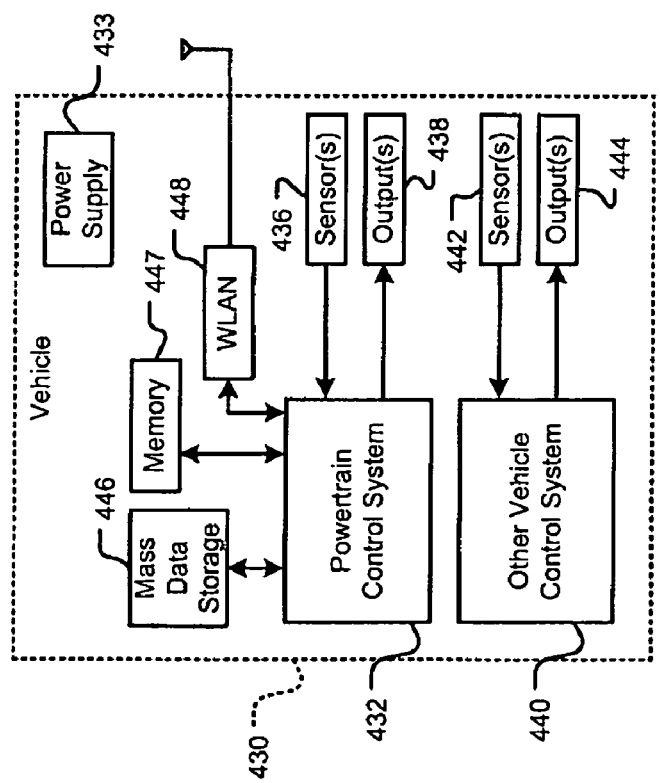
FIG. 13D is a functional block diagram of a vehicle control system.

Referring now to FIG. 13D, the systems and methods disclosed herein may be implemented in a powertrain control system 432 of a control system of a vehicle 430. In some implementations, the powertrain control system 432 receives inputs from one or more sensors such as temperature sensors, pressure sensors, rotational sensors, airflow sensors and/or any other suitable sensors and/or generates one or more output control signals such as engine operating parameters, transmission operating parameters, and/or other control signals.

A control system 440 may likewise receive signals from input sensors 442 and/or output control signals to one or more output devices 444. The systems and methods disclosed herein may be implemented in the control system 440. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc, etc. Still other implementations are contemplated.

The powertrain control system 432 may communicate with a mass data storage 446 that stores data in a nonvolatile manner. The mass data storage 446 may include optical and/or magnetic storage devices such as hard disk drives (HDDs) and/or DVD drives. At least one HDD may have the configuration shown in FIG. 13A and/or at least one DVD drive may have the configuration shown in FIG. 13B. The HDD may be a mini HDD that includes one or more platters having a diameter that is smaller than approximately 1.8".

The powertrain control system 432 may be connected to memory 447 such as RAM, ROM, low latency nonvolatile memory such as flash memory, and/or other suitable electronic data storage. The powertrain control system 432 also may support connections to a WLAN via a WLAN interface 448. The control system 440 may also include mass data storage, memory, and/or a WLAN interface (all not shown).

Referring now to FIG. 13E, the systems and methods disclosed herein can be implemented in a signal processing and/or control circuit 452 of a cellular phone 450 that may include a cellular antenna 451. In some implementations, the cellular phone 450 includes a microphone 456, an audio output 458 such as a speaker and/or audio output jack, a display 460 and/or an input device 462 such as a keypad, a pointing device, and/or other input device. The signal processing and/or control circuit 452 and/or other circuits (not shown) in the cellular phone 450 may process data, perform coding and/or encryption, perform calculations, format data and/or perform other cellular phone functions.

The cellular phone 450 may communicate with a mass data storage 464 that stores data in a nonvolatile manner and includes optical and/or magnetic storage devices such as hard disk drives (HDDs) and/or digital versatile disk (DVD) drives. At least one HDD may have the configuration shown in FIG. 13A and/or at least one DVD drive may have the configuration shown in FIG. 13B. The HDD may be a mini HDD that includes one or more platters having a diameter that is smaller than approximately 1.8". The cellular phone 450 may be connected to memory 466 such as RAM, ROM, low latency nonvolatile memory such as flash memory, and/or other suitable electronic data storage. The cellular phone 450 also may support connections to a WLAN via a WLAN interface 468.

Figure 13F:
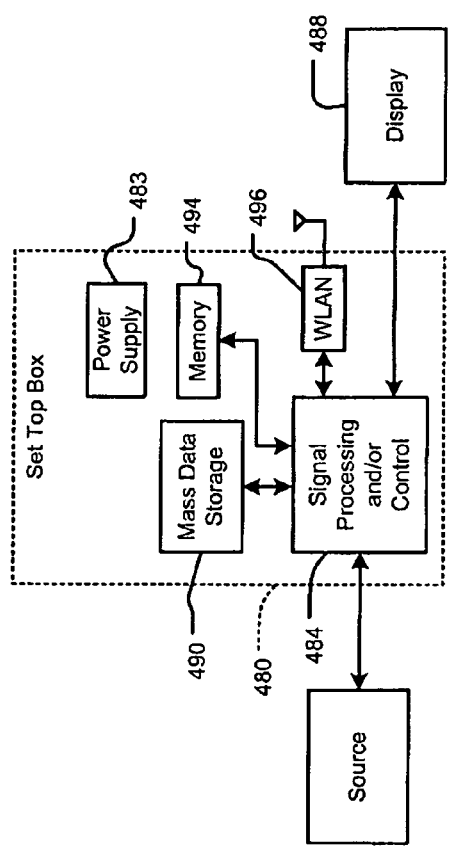
FIG. 13F is a functional block diagram of a set top box.

Referring now to FIG. 13F, the systems and methods disclosed herein can be implemented in a signal processing and/or control circuit 484 of a set top box 480. The set top box 480 receives signals from a source such as a broadband source and outputs standard and/or high definition audio/video signals suitable for a display 488 such as a television and/or a monitor and/or other video and/or audio output devices. The signal processing and/or control circuit 484 and/or other circuits (not shown) of the set top box 480 may process data, perform coding and/or encryption, perform calculations, format data, and/or perform any other set top box function.

The set top box 480 may communicate with a mass data storage 490 that stores data in a nonvolatile manner. The mass data storage 490 may include optical and/or magnetic storage devices such as hard disk drives (HDDs) and/or DVD drives. At least one HDD may have the configuration shown in FIG. 13A and/or at least one DVD drive may have the configuration shown in FIG. 13B. The HDD may be a mini HDD that includes one or more platters having a diameter that is smaller than approximately 1.8". The set top box 480 may be connected to memory 494 such as RAM, ROM, low latency nonvolatile memory such as flash memory, and/or other suitable electronic data storage. The set top box 480 also may support connections with a WLAN via a WLAN interface 496.

Figure 13G:
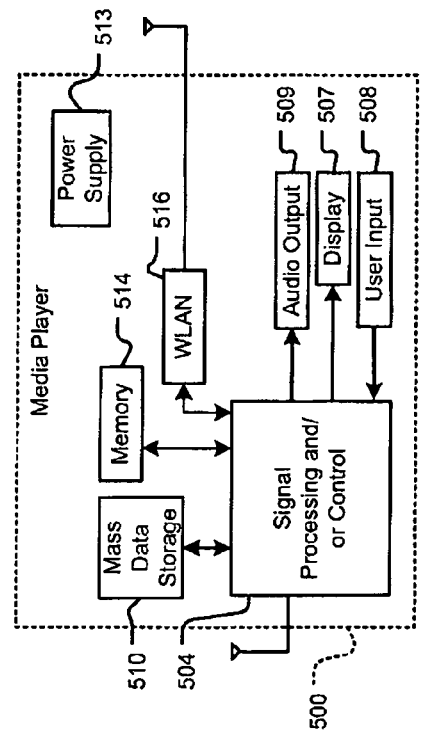
FIG. 13G is a functional block diagram of a media player.

Referring now to FIG. 13G, the systems and methods disclosed herein can be implemented in a signal processing and/or control circuit 504 of a media player 500. In some implementations, the media player 500 includes a display 507 and/or a user input 508 such as a keypad, a touchpad, etc. In some implementations, the media player 500 may employ a graphical user interface (GUI) that typically employs menus, icons, and/or a point-and-click interface via the display 507 and/or user input 508. The media player 500 further includes an audio output 509 such as a speaker and/or audio output jack. The signal processing and/or control circuit 504 and/or other circuits (not shown) of the media player 500 may process data, perform coding and/or encryption, perform calculations, format data, and/or perform any other media player function.

The media player 500 may communicate with a mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices such as hard disk drives (HDDs) and/or DVD drives. At least one HDD may have the configuration shown in FIG. 13A and/or at least one DVD drive may have the configuration shown in FIG. 13B. The HDD may be a mini HDD that includes one or more platters having a diameter that is smaller than approximately 1.8".

The media player 500 may be connected to memory 514 such as RAM, ROM, low latency nonvolatile memory such as flash memory, and/or other suitable electronic data storage. The media player 500 also may support connections to a WLAN via a WLAN interface 516. Still other implementations in addition to those described above are contemplated.

Those skilled in the art can now appreciate from the foregoing description that the broad teachings of the present disclosure can be implemented in a variety of forms. Therefore, while the present disclosure includes particular examples, the true scope of the present disclosure should not be so limited since other modifications will become apparent to the skilled practitioner upon a study of the drawings, the specification and the following claims.

What is claimed is:

1. A device, comprising:
   a supernode generator module that generates S supernodes each comprising d symbol nodes, where S and d are integers greater than 1;
   a supernode splitting module that splits each of said S supernodes into d derived symbols, wherein a total number of symbol edges of said d derived symbols is equal to a predetermined number of symbol edges of each of said S supernodes; and
   a control module that generates a quasi-cyclic irregular low density parity check (LDPC) code based on S*d derived symbols, wherein S equals said S supernodes and d equals said d derived symbols.

2. The device of claim 1 wherein said supernode generator module receives data that includes n symbol nodes each having symbol edges that connect said n symbol nodes to r check nodes, where n and r are integers greater than 1 and n=S*d.

3. The device of claim 2 wherein said supernode generator module selects said d symbol nodes from said n symbol nodes and groups said d symbol nodes in each of said S supernodes, and wherein a sum of symbol edges of said d symbol nodes is the same for each of said S supernodes.

4. The device of claim 1 wherein every $P^{th}$ derived symbol generated by said S supernodes that are separated by a predetermined supernode distance has the same number of symbol edges, where P is an integer and $1 \leq P \leq d$.

5. The device of claim 1 wherein said d derived symbols connect to r check nodes with said predetermined number of symbol edges, where r is an integer greater than 1.

6. The device of claim 1 wherein said control module performs a permutation of said predetermined number of symbol edges of said S*d derived symbols and check node edges of r check nodes using a permutation polynomial, where r is an integer greater than 1.

7. The device of claim 6 wherein said control module generates an irregular LDPC code based on said permutation.

8. The device of claim 1 wherein said control module generates a parity check matrix, wherein columns of said parity check matrix comprise said S*d derived symbols and rows of said parity check matrix comprise r check nodes, where r is an integer greater than 1.

9. The device of claim 8 wherein said control module performs permutations of columns and rows of said parity check matrix and generates a quasi-cyclic parity check matrix.

10. The device of claim 9 wherein said quasi-cyclic parity check matrix comprises submatrices that are circulant matrices.

11. The device of claim 10 wherein each of said circulant matrices comprises derived symbols that are selected from said S*d derived symbols, that have the same number of symbol edges, and that are generated by said S supernodes that are separated by a predetermined supernode distance.

12. The device of claim 11 wherein a distance between said derived symbols that are selected from said S*d derived symbols is equal to said predetermined supernode distance multiplied by d.

13. The device of claim 9 wherein said control module generates said quasi-cyclic irregular LDPC code based on said quasi-cyclic parity check matrix.

14. The device of claim 9 wherein said control module joins said quasi-cyclic parity check matrix and a square quasi-cyclic matrix.

15. The device of claim 14 wherein said square quasi-cyclic matrix is an identity matrix.

16. The device of claim 14 wherein said square quasi-cyclic matrix comprises circulant matrices of the same size.

17. The device of claim 16 wherein said circulant matrices have a row weight and a column weight equal to 1.

18. The device of claim 16 wherein a row weight and a column weight of a last of said circulant matrices are equal to 2.

19. The device of claim 9 wherein said quasi-cyclic parity check matrix is a sparse matrix.

20. A system comprising the device of claim 1, wherein the device generates a plurality of quasi-cyclic irregular LDPC codes.

21. The system of claim 20 further comprising:
   a decoder module that communicates with said device and that decodes said LDPC codes; and
   a code selection module that communicates with said decoder module and that determines error-correcting ability of said LDPC codes by calculating at least one of burst correction power and girth of said LDPC codes.

22. The system of claim 21 wherein said code selection module calculates said girth based on Tanner graphs constructed using said S*d derived symbols.

23. The system of claim 21 further comprising a burst selection module that selects bursts of M consecutive symbols from a data block encoded by one of said LDPC codes, where M is an integer at least equal to 1.

24. The system of claim 23 wherein said code selection module inputs incorrect log-likelihood ratios (LLRs) for said M consecutive symbols to said decoder module and determines whether said decoder module correctly decodes said data block.

25. The system of claim 24 wherein said code selection module determines said burst correction power of said one of said LDPC codes as a value of M when said decoder module fails to decode said data block.

26. A method for generating quasi-cyclic irregular low density parity check (LDPC) codes using an encoder, the method comprising:
- generating S supernodes each comprising d symbol nodes, where S and d are integers greater than 1;
- splitting each of said S supernodes into d derived symbols, wherein a total number of symbol edges of said d derived symbols is equal to a predetermined number of symbol edges of each of said S supernodes; and
- generating a quasi-cyclic irregular low density parity check (LDPC) code based on S*d derived symbols using said encoder, wherein S equals said S supernodes and d equals said d derived symbols.

27. The method of claim 26 further comprising receiving data that includes n symbol nodes each having symbol edges that connect said n symbol nodes to r check nodes, where n and r are integers greater than 1 and n=S*d.

28. The method of claim 27 further comprising selecting said d symbol nodes from said n symbol nodes and grouping said d symbol nodes in each of said S supernodes, and wherein a sum of symbol edges of said d symbol nodes is the same for each of said S supernodes.

29. The method of claim 26 wherein every $P^{th}$ derived symbol generated by said S supernodes that are separated by a predetermined supernode distance has the same number of symbol edges, where P is an integer and $1 \leq P \leq d$.

30. The method of claim 26 wherein said d derived symbols connect to r check nodes with said predetermined number of symbol edges, where r is an integer greater than 1.

31. The method of claim 26 further comprising performing a permutation of said predetermined number of symbol edges of said S*d derived symbols and check node edges of r check nodes using a permutation polynomial, where r is an integer greater than 1.

32. The method of claim 31 further comprising generating an irregular LDPC code based on said permutation.

33. The method of claim 26 further comprising generating a parity check matrix, wherein columns of said parity check matrix comprise said S*d derived symbols and rows of said parity check matrix comprise r check nodes, where r is an integer greater than 1.

34. The method of claim 33 further comprising performing permutations of columns and rows of said parity check matrix and generating a quasi-cyclic parity check matrix.

35. The method of claim 34 wherein said quasi-cyclic parity check matrix comprises submatrices that are circulant matrices.

36. The method of claim 35 wherein each of said circulant matrices comprises derived symbols that are selected from said S*d derived symbols, that have the same number of symbol edges, and that are generated by said S supernodes that are separated by a predetermined supernode distance.

37. The method of claim 36 wherein a distance between said derived symbols that are selected from said S*d derived symbols is equal to said predetermined supernode distance multiplied by d.

38. The method of claim 34 further comprising generating said quasi-cyclic irregular LDPC code based on said quasi-cyclic parity check matrix.

39. The method of claim 34 further comprising joining said quasi-cyclic parity check matrix and a square quasi-cyclic matrix.

40. The method of claim 39 wherein said square quasi-cyclic matrix is an identity matrix.

41. The method of claim 39 wherein said square quasi-cyclic matrix comprises circulant matrices of the same size.

42. The method of claim 41 wherein said circulant matrices have a row weight and a column weight equal to 1.

43. The method of claim 41 wherein a row weight and a column weight of a last of said circulant matrices are equal to 2.

44. The method of claim 34 wherein said quasi-cyclic parity check matrix is a sparse matrix.

45. The method of claim 26 further comprising generating a plurality of quasi-cyclic irregular LDPC codes.

46. The method of claim 45 further comprising:
- decoding said LDPC codes; and
- determining error-correcting ability of said LDPC codes by calculating at least one of burst correction power and girth of said LDPC codes.

47. The method of claim 46 further comprising calculating said girth based on Tanner graphs constructed using said S*d derived symbols.

48. The method of claim 46 further comprising selecting bursts of M consecutive symbols from a data block encoded by one of said LDPC codes, where M is an integer at least equal to 1.

49. The method of claim 48 further comprising inputting incorrect log-likelihood ratios (LLRs) for said M consecutive symbols and determining whether said data block is correctly decoded.

50. The method of claim 49 further comprising determining said burst correction power of said one of said LDPC codes as a value of M when said data block cannot be correctly decoded.

* * * * *